US012439603B2

(12) United States Patent
Jung et al.

(10) Patent No.: US 12,439,603 B2
(45) Date of Patent: Oct. 7, 2025

(54) SEMICONDUCTOR DEVICE INCLUDING SEPARATE UPPER CHANNEL STRUCTURES AND ELECTRONIC SYSTEM INCLUDING THE SAME

(71) Applicant: Samsung Electronics Co., Ltd., Suwon-si (KR)

(72) Inventors: Euntaek Jung, Hwaseong-si (KR); Jaeho Kim, Hwaseong-si (KR); Joonsung Kim, Seoul (KR); Jiwon Kim, Hwaseong-si (KR); Sukkang Sung, Seongnam-si (KR); Sangdon Lee, Hwaseong-si (KR); Jong-Min Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 584 days.

(21) Appl. No.: 17/690,154

(22) Filed: Mar. 9, 2022

(65) Prior Publication Data
US 2023/0014037 A1    Jan. 19, 2023

(30) Foreign Application Priority Data

Jul. 14, 2021    (KR) .................. 10-2021-0092350

(51) Int. Cl.
*H10B 43/35*    (2023.01)
*G11C 16/04*    (2006.01)
(Continued)

(52) U.S. Cl.
CPC ......... *H10B 43/35* (2023.02); *G11C 16/0483* (2013.01); *H01L 23/5283* (2013.01);
(Continued)

(58) Field of Classification Search
CPC ..... G11C 16/0483; H10B 41/10; H10B 41/27; H10B 43/20
(Continued)

(56) References Cited

U.S. PATENT DOCUMENTS 9,520,408 B2    12/2016    Kim
10,297,610 B2    5/2019    Kai et al.
(Continued)

FOREIGN PATENT DOCUMENTS

JP    2020-145218 A    9/2020
KR    10-2019-0143691 A    12/2019

*Primary Examiner* — Norman D Richards
*Assistant Examiner* — Laura M Dykes
(74) *Attorney, Agent, or Firm* — Wolf, Greenfield & Sacks, P.C.

(57) ABSTRACT

A semiconductor device includes an electrode structure including electrodes stacked on a substrate and an insulating pattern on an uppermost electrode of the electrodes, a vertical structure that penetrates the electrode structure and is connected to the substrate, a first insulating layer on the electrode and the vertical structure, a conductive pattern that penetrates the first insulating layer and is connected to the vertical structure, an upper horizontal electrode on the conductive pattern, and an upper semiconductor pattern that penetrates the upper horizontal electrode and is connected to the conductive pattern. The conductive pattern has a first side surface on the vertical structure and a second side surface on the insulating pattern.

20 Claims, 35 Drawing Sheets

(51) Int. Cl.
  *H01L 23/528*    (2006.01)
  *H10B 41/10*     (2023.01)
  *H10B 41/27*     (2023.01)
  *H10B 41/35*     (2023.01)
  *H10B 41/40*     (2023.01)
  *H10B 43/10*     (2023.01)
  *H10B 43/27*     (2023.01)
  *H10B 43/40*     (2023.01)

(52) U.S. Cl.
  CPC ............. *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/40* (2023.02)

(58) Field of Classification Search
  USPC ........................................................ 257/314
  See application file for complete search history.

(56)            References Cited

U.S. PATENT DOCUMENTS

| | | |
|---|---|---|
| 10,734,406 B2 | 8/2020 | Yamasaki et al. |
| 10,777,575 B1 | 9/2020 | Cui et al. |
| 10,833,096 B2 | 11/2020 | Tanaka et al. |
| 10,937,800 B2 | 3/2021 | Kim et al. |
| 10,950,622 B2 | 3/2021 | Kondo |
| 2015/0255486 A1 | 9/2015 | Kameoka et al. |
| 2017/0287928 A1 | 10/2017 | Kanamori et al. |
| 2020/0286910 A1 | 9/2020 | Kashima |
| 2020/0303399 A1* | 9/2020 | Xiao ................. H01L 21/76802 |
| 2022/0149053 A1* | 5/2022 | Lee ........................ H10B 43/27 |

* cited by examiner

SEMICONDUCTOR DEVICE INCLUDING SEPARATE UPPER CHANNEL STRUCTURES AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0092350, filed on Jul. 14, 2021, in the Korean Intellectual Property Office, the entire contents of which are hereby incorporated by reference.

FIELD

The present disclosure relates to a semiconductor device and an electronic system including the same.

BACKGROUND

Higher integration of semiconductor devices may be required to satisfy consumer demands for high performance and low cost. In the case of semiconductor devices, since integration may be a factor in determining price, increased integration may be especially desired. In the case of two-dimensional or planar semiconductor devices, since integration may mainly be determined by the area occupied by a unit memory cell, integration may be greatly influenced by the level or resolution of a fine pattern forming technology. However, expensive process equipment may be needed to increase pattern fineness, which may be a practical limitation on increasing integration for two-dimensional or planar semiconductor devices. Thus, three-dimensional semiconductor memory devices including three-dimensionally arranged memory cells have been proposed.

SUMMARY

An embodiment of the inventive concept provides a semiconductor device with improved reliability and an increased integration density.

An embodiment of the inventive concept provides an electronic system including the semiconductor device.

According to an embodiment of the inventive concept, a semiconductor device may include an electrode structure including electrodes stacked on a substrate and an insulating pattern on an uppermost electrode of the electrodes, a vertical structure that penetrates the electrode structure and is electrically connected to the substrate, a first insulating layer on the electrode structure and the vertical structure, a conductive pattern that penetrates the first insulating layer and is electrically connected to the vertical structure, an upper horizontal electrode on the conductive pattern, and an upper semiconductor pattern that penetrates the upper horizontal electrode and is electrically connected to the conductive pattern. The conductive pattern may have a first side surface on the vertical structure and a second side surface on the insulating pattern.

According to an embodiment of the inventive concept, a semiconductor device may include an electrode structure including electrodes and insulating patterns that are alternately stacked, a pair of separation structures crossing the electrode structure and spaced apart from each other in a first direction, a vertical structure between the pair of separation structures and penetrating the electrode structure, the vertical structure including a vertical semiconductor pattern and a conductive pad on the vertical semiconductor pattern, a first insulating layer on the electrode structure and the vertical structure, a capping pattern between the first insulating layer and the conductive pad, a conductive pattern that penetrates the first insulating layer and the capping pattern and is electrically connected to the conductive pad, a second insulating layer on the first insulating layer and the conductive pattern, an upper horizontal electrode on the second insulating layer, a pair of first upper separation patterns crossing the upper horizontal electrode in a second direction perpendicular to the first direction and vertically overlapping with the pair of separation structures, a second upper separation pattern between the pair of first upper separation patterns and crossing the upper horizontal electrode in the second direction, an upper channel structure that penetrates the upper horizontal electrode and the second insulating layer and is electrically connected to the conductive pad, the upper channel structure including an upper semiconductor pattern and an upper insulating pattern on the upper semiconductor pattern, an interlayer insulating layer on the upper channel structure, a bit line on the interlayer insulating layer, and a contact plug that penetrates the interlayer insulating layer and electrically connects the bit line to the upper channel structure.

According to an embodiment of the inventive concept, an electronic system may include a main substrate, a semiconductor device on the main substrate, and a controller on the main substrate and electrically connected to the semiconductor device. The semiconductor device may include a peripheral circuit on a substrate, an electrode structure including electrodes stacked on the peripheral circuit and an insulating pattern on an uppermost one of the electrodes, a vertical structure that penetrates the electrode structure and is electrically connected to the substrate, a first insulating layer on the insulating pattern and the vertical structure, a conductive pattern that penetrates the first insulating layer and is electrically connected to the vertical structure, an upper horizontal electrode on the conductive pattern, and an upper channel structure that penetrates the upper horizontal electrode and is electrically connected to the conductive pattern. The conductive pattern may include a first side surface on the vertical structure and a second side surface on the insulating pattern.

DETAILED DESCRIPTION

Example embodiments of the inventive concepts will now be described more fully with reference to the accompanying drawings, in which example embodiments are shown.

Figure 1:
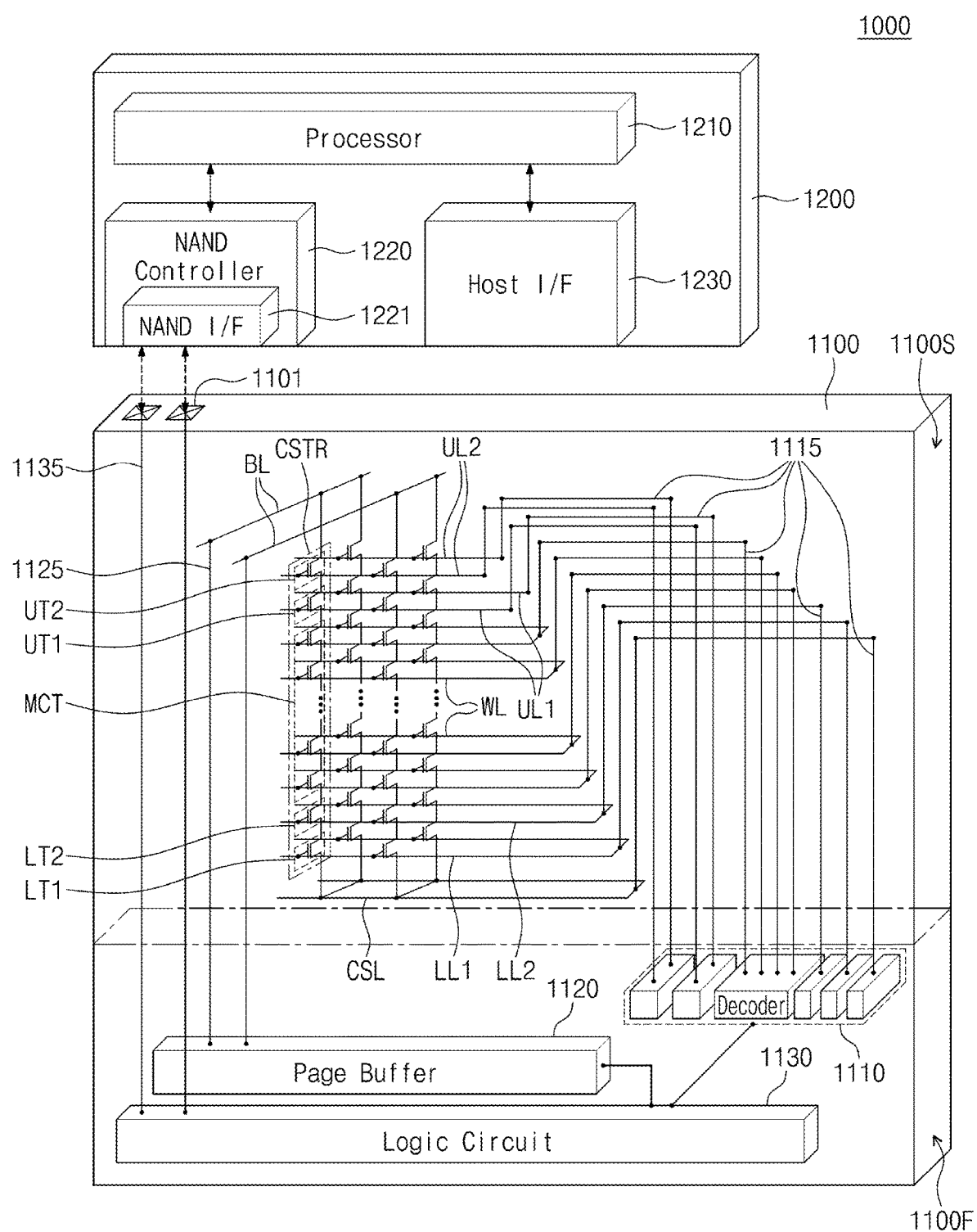
FIG. 1 is a diagram schematically illustrating an electronic system including a semiconductor device according to an embodiment of the inventive concept.

FIG. 1 is a diagram schematically illustrating an electronic system including a semiconductor device according to an embodiment of the inventive concept.

Referring to FIG. 1, an electronic system 1000 according to an embodiment of the inventive concept may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device).

The semiconductor device 1100 may include a first structure 1100F and a second structure 1100S on the first structure 1100F. The terms, "first," "second," etc., may be used herein merely to distinguish one element or layer from another. Elements or layers that are "on" or "connected to" one another may be directly on or directly connected to one another (i.e., without intervening elements or layers), or intervening elements or layers may be present. As an example, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, at least one of the upper transistors UT1 and UT2 may include the string selection transistor, and at least one of the lower transistors LT1 and LT2 may include a ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which extend from the first structure 1100F to the second structure 1100S. The bit lines BL may be electrically connected to the page buffer 1120 through second connection lines 1125, which extend from the first structure 1100F to the second structure 1100S.

In the first structure 1100F, the decoder circuit 1110 and the page buffer 1120 may be configured to perform a control operation on at least one memory cell transistor that is selected from the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is provided in the first structure 1100F and extends into the second structure 1100S.

The controller 1200 may include a processor 1210, a NAND controller 1220, and a host interface 1230. In an embodiment, the electronic system 1000 may include a plurality of semiconductor devices 1100, and in this case, the controller 1200 may control the semiconductor devices 1100.

The processor 1210 may control overall operations the electronic system 1000 including the controller 1200. The processor 1210 may be operated depending on a specific firmware and may access the semiconductor device 1100 through control of the NAND controller 1220. The NAND controller 1220 may include a NAND interface 1221 which is used for communication with the semiconductor device 1100. The NAND interface 1221 may be used to transmit and receive control commands, which are used to control the semiconductor device 1100, data, which will be written in or read from the memory cell transistors MCT of the semiconductor device 1100, and so forth. The host interface 1230 may be configured to allow for communication between the electronic system 1000 and an external host. When a control command is received from the external host through the host interface 1230, the processor 1210 may control the semiconductor device 1100 in response to the control command.

Figure 2:
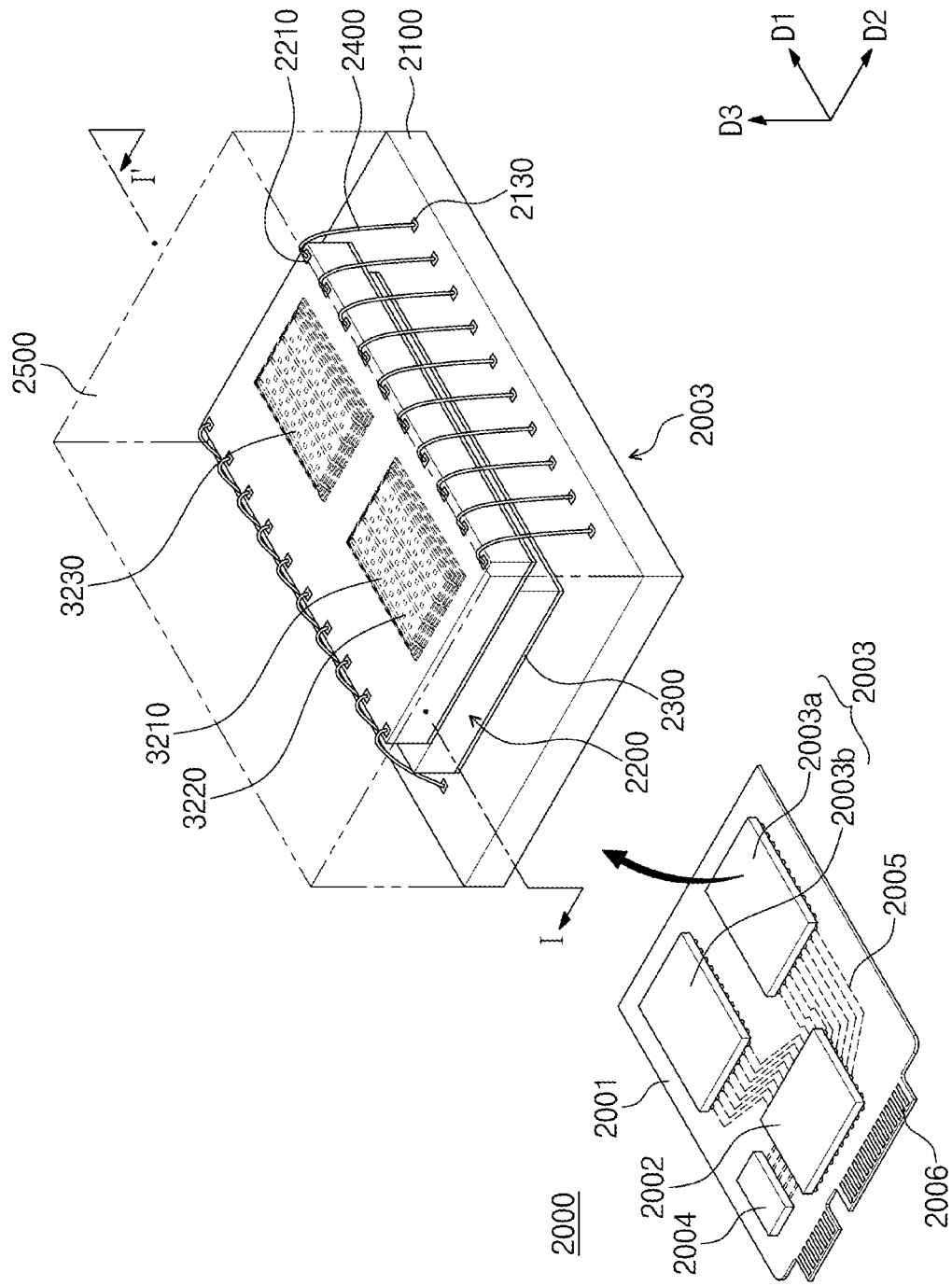
FIG. 2 is a perspective view schematically illustrating an electronic system including a semiconductor device according to an embodiment of the inventive concept.

FIG. 2 is a perspective view schematically illustrating an electronic system including a semiconductor device according to an embodiment of the inventive concept.

Referring to FIG. 2, an electronic system 2000 according to an embodiment of the inventive concept may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an embodiment, the electronic system 2000 may be driven by electrical power, which is supplied from the external host through the connector 2006. The electronic system 2000 may further include a power management integrated circuit (PMIC) that is configured to separately supply electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which may relieve technical difficulties or compatibility issues caused by a difference in speed between the semiconductor package 2003, which serves as a data storage device, and an external host. In an embodiment, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to control the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pad portions 2130. Each of the semiconductor chips 2200 may include an input/output pad portion 2210. The input/output pad portion 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to an embodiment of the inventive concept.

In an embodiment, the connection structure 2400 may be a bonding wire electrically connecting the input/output pad portion 2210 to the package upper pad portions 2130. In each of the first and second semiconductor packages 2003a and 2003b, the semiconductor chips 2200 may be electrically connected to each other in a bonding wire manner and may be electrically connected to the package upper pad portions 2130 of the package substrate 2100. In an embodiment, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared independent of the main substrate 2001, and may be connected to each other through interconnection lines, which are provided in the interposer substrate.

Figure 3:
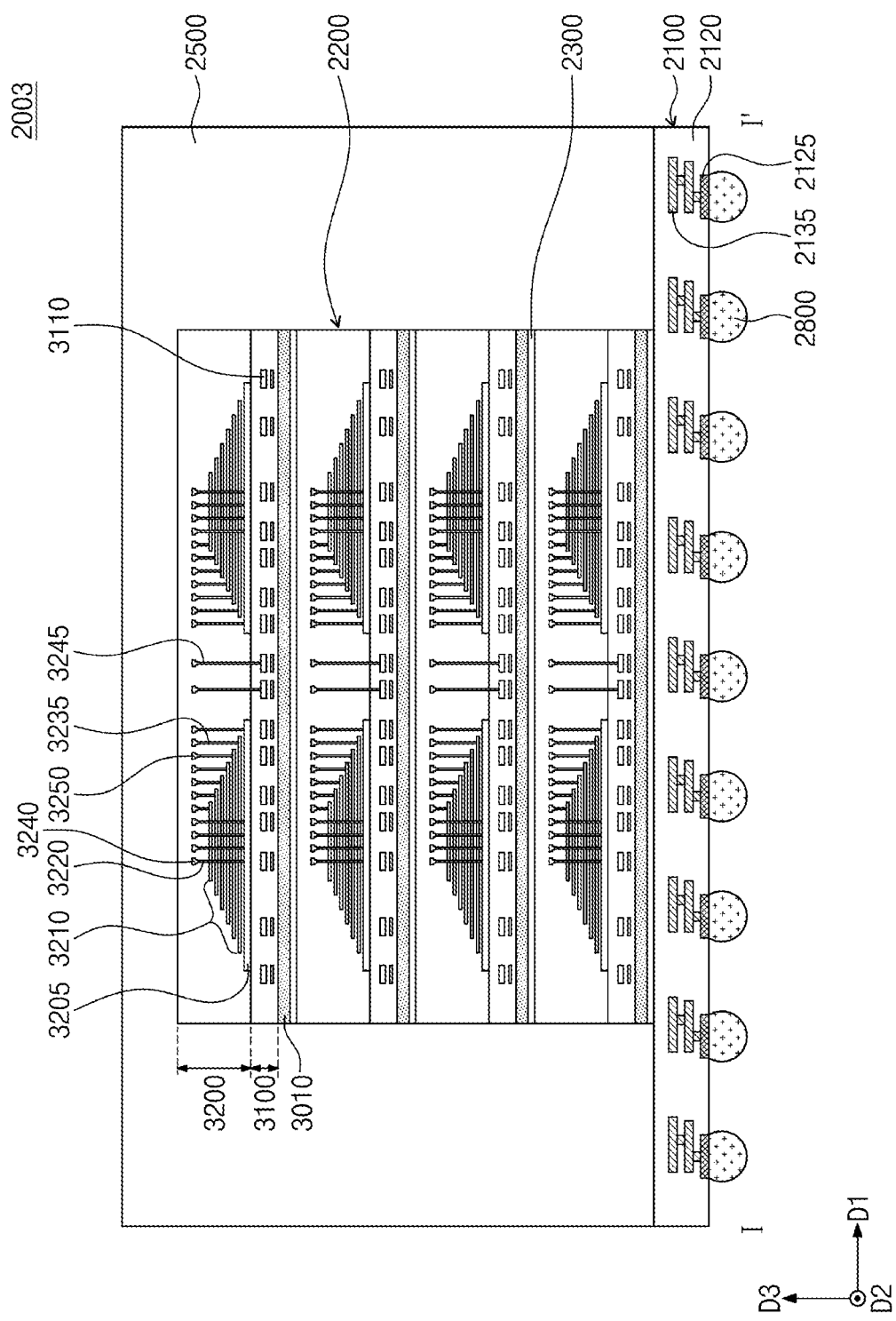
FIGS. 3 and 4 are sectional views, each of which schematically illustrates a semiconductor package according to an embodiment of the inventive concept.
Figure 4:
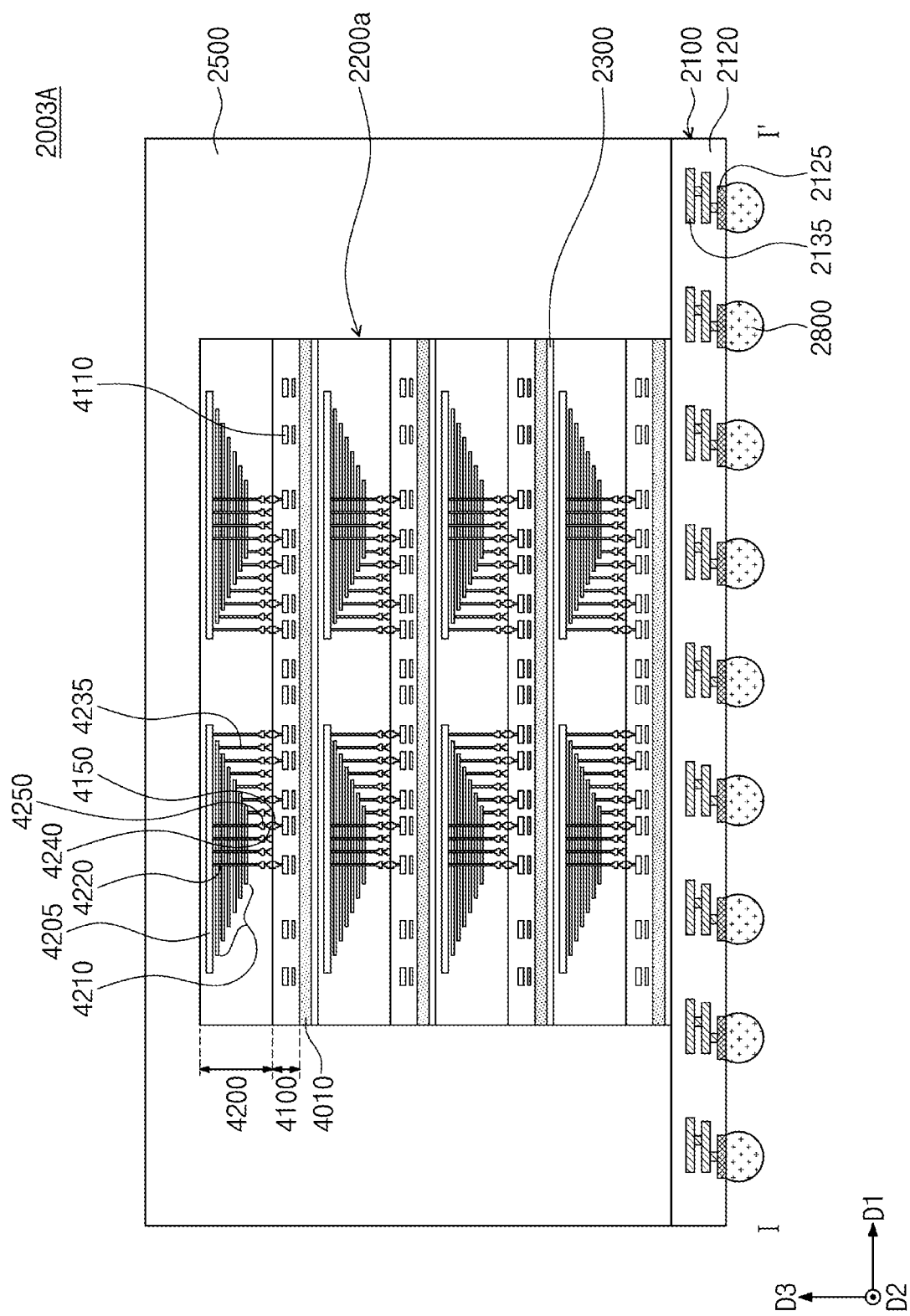

FIGS. 3 and 4 are sectional views, each of which schematically illustrates a semiconductor package according to an embodiment of the inventive concept. FIGS. 3 and 4 conceptually illustrate two different examples of the semiconductor package of FIG. 2 and are, for example, sectional views taken along a line I-I' of FIG. 2.

Referring to FIG. 3, in the semiconductor package 2003, the package substrate 2100 may be a printed circuit board. The package substrate 2100 may include a package substrate body portion 2120, the package upper pad portions 2130 (e.g., of FIG. 2) disposed on a top surface of the package substrate body portion 2120, lower pad portions 2125, which are disposed on or exposed through a bottom surface of the package substrate body portion 2120, and internal lines 2135, which are provided in the package substrate body portion 2120 to electrically connect the package upper pad portions 2130 to the lower pad portions 2125. The lower pad portions 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 penetrating the stack 3210, bit lines 3240 electrically connected to the vertical structures 3220, and cell contact plugs 3235 electrically connected to the word lines WL (e.g., see FIG. 1) of the stack 3210. The second structure 3200 may further include separation structures 3230 (e.g., see FIG. 2), which will be described in more detail below.

Each of the semiconductor chips 2200 may include penetration lines 3245, which are electrically connected to the peripheral lines 3110 of the first structure 3100 and extend into the second structure 3200. The penetration line 3245 may be disposed outside the stack 3210 or may be disposed to penetrate the stack 3210. Each of the semiconductor chips 2200 may further include the input/output pad portions 2210 (e.g., of FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 penetrating the stack 4210, and second junction structures 4240 electrically and respectively connected to the vertical structures 4220 and the word lines WL (e.g., see FIG. 1) of the stack 4210. For example, the second junction structures 4240 may be electrically connected to the vertical structures 4220 and the word lines WL (e.g., see FIG. 1) respectively through bit lines 4250 and cell contact plugs 4235, which are electrically connected to the vertical structures 4220 and the word lines WL (e.g., see FIG. 1), respectively. The first junction structures 4150 of the first structure 4100 and the second junction structures 4240 of the second structure 4200 may be in contact with each other and may be bonded to each other. Portions of the first and second junction structures 4150 and 4240, which are bonded to each other, may be formed of, for example, copper (Cu). Each of the semiconductor chips 2200a may further include the input/output pad portions 2210 (e.g., see FIG. 2), which are electrically connected to the peripheral lines 4110 of the first structure 4100.

The semiconductor chips 2200 of FIG. 3 and the semiconductor chips 2200a of FIG. 4 may be electrically connected to each other by the connection structures 2400 (e.g., see FIG. 2), which are provided in the form of bonding wires. However, in an embodiment, the semiconductor chips (e.g., 2200 or 2200a), which are provided in each semiconductor package, may be electrically connected to each other by a connection structure including through silicon vias (TSVs).

The first structure 3100 of FIG. 3 and the first structure 4100 of FIG. 4 may correspond to a peripheral circuit structure in an embodiment to be described below, and the second structure 3200 of FIG. 3 and the second structure 4200 of FIG. 4 may correspond to a cell array structure in an embodiment to be described below.

Figure 5:
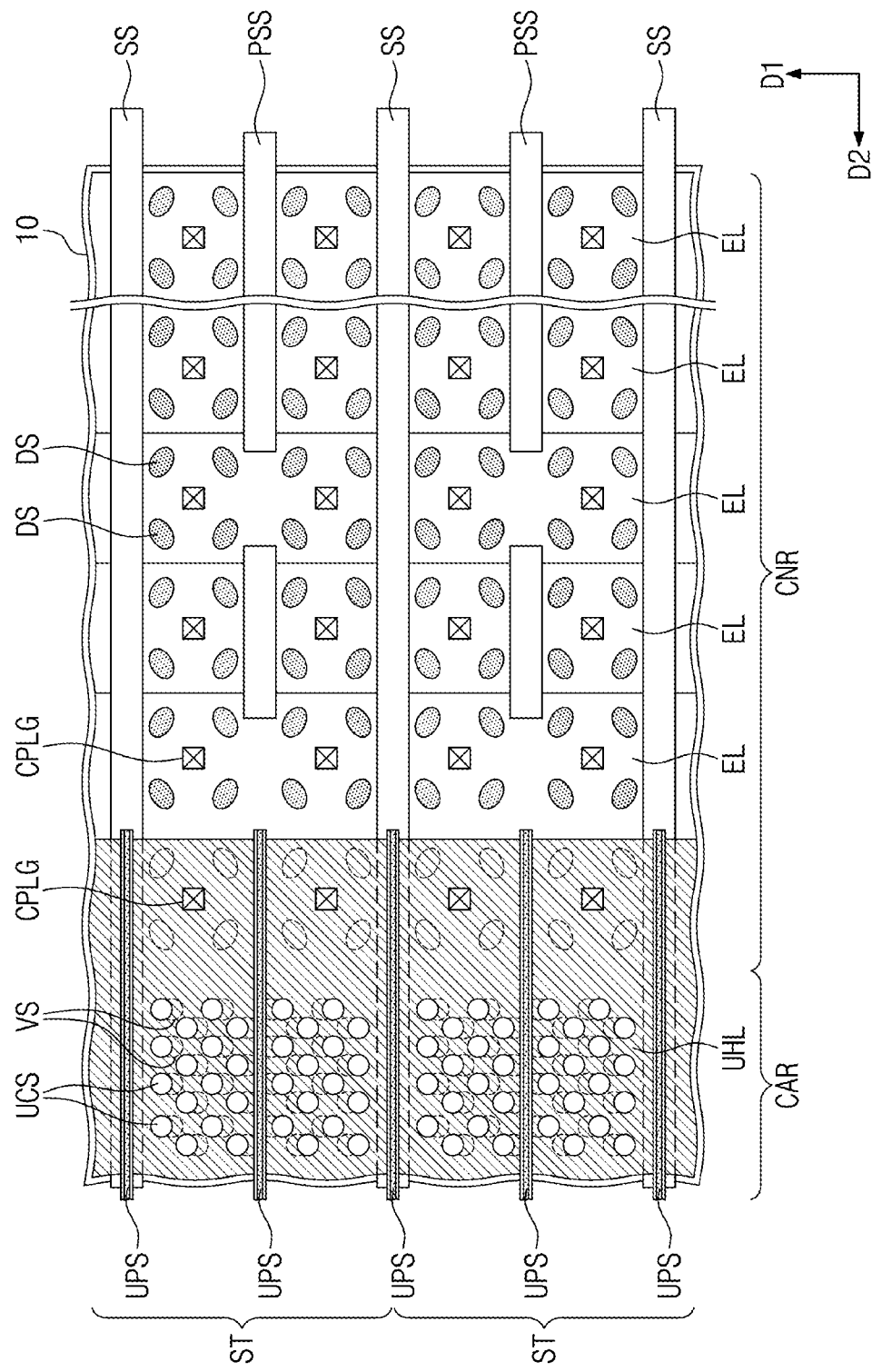
FIG. 5 is a plan view illustrating a semiconductor device according to an embodiment of the inventive concept.

FIG. 5 is a plan view illustrating a semiconductor device according to an embodiment of the inventive concept.

Figure 6:
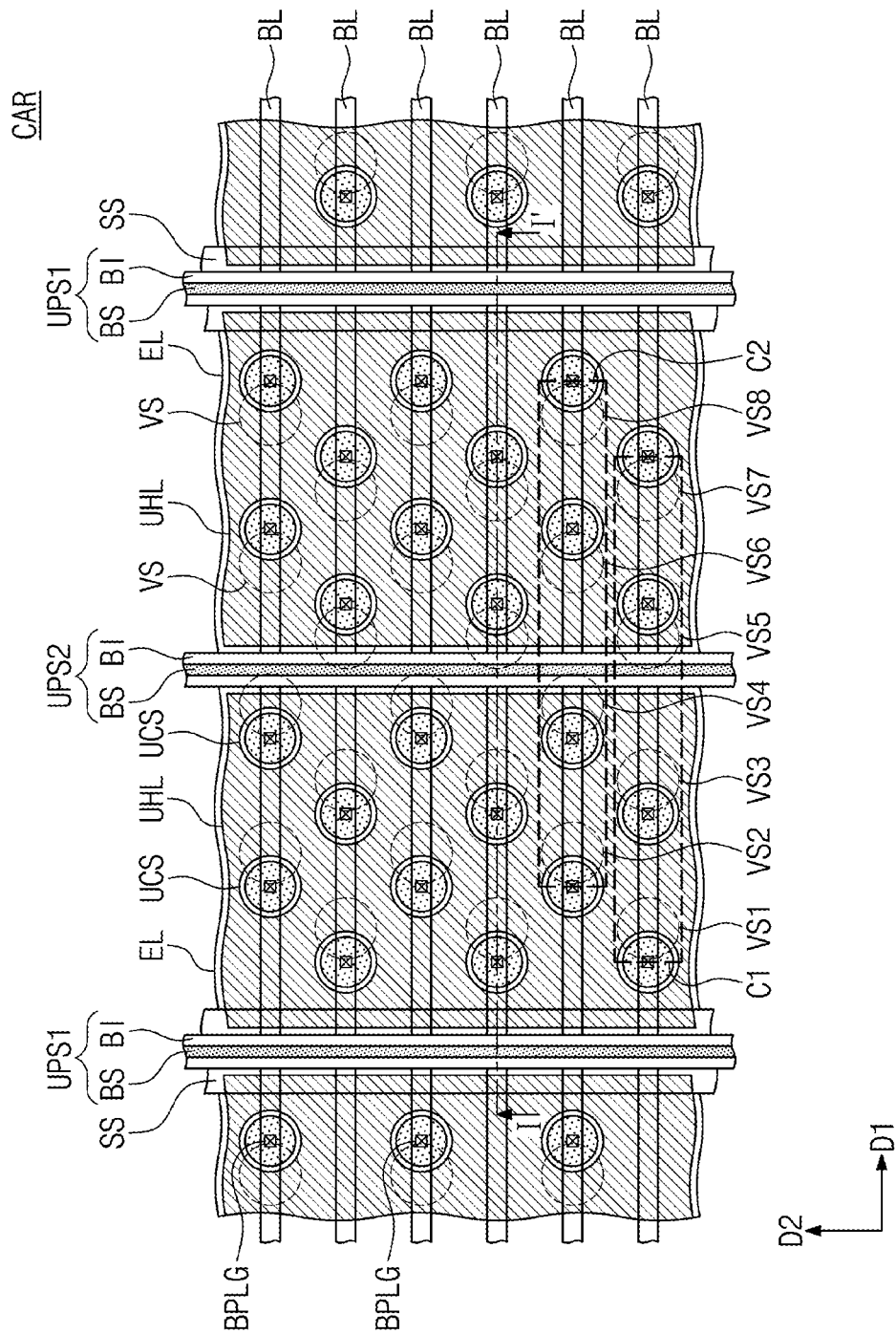
FIG. 6 is an enlarged plan view illustrating a portion of a cell array region of a semiconductor device according to an embodiment of the inventive concept.
Figure 7:
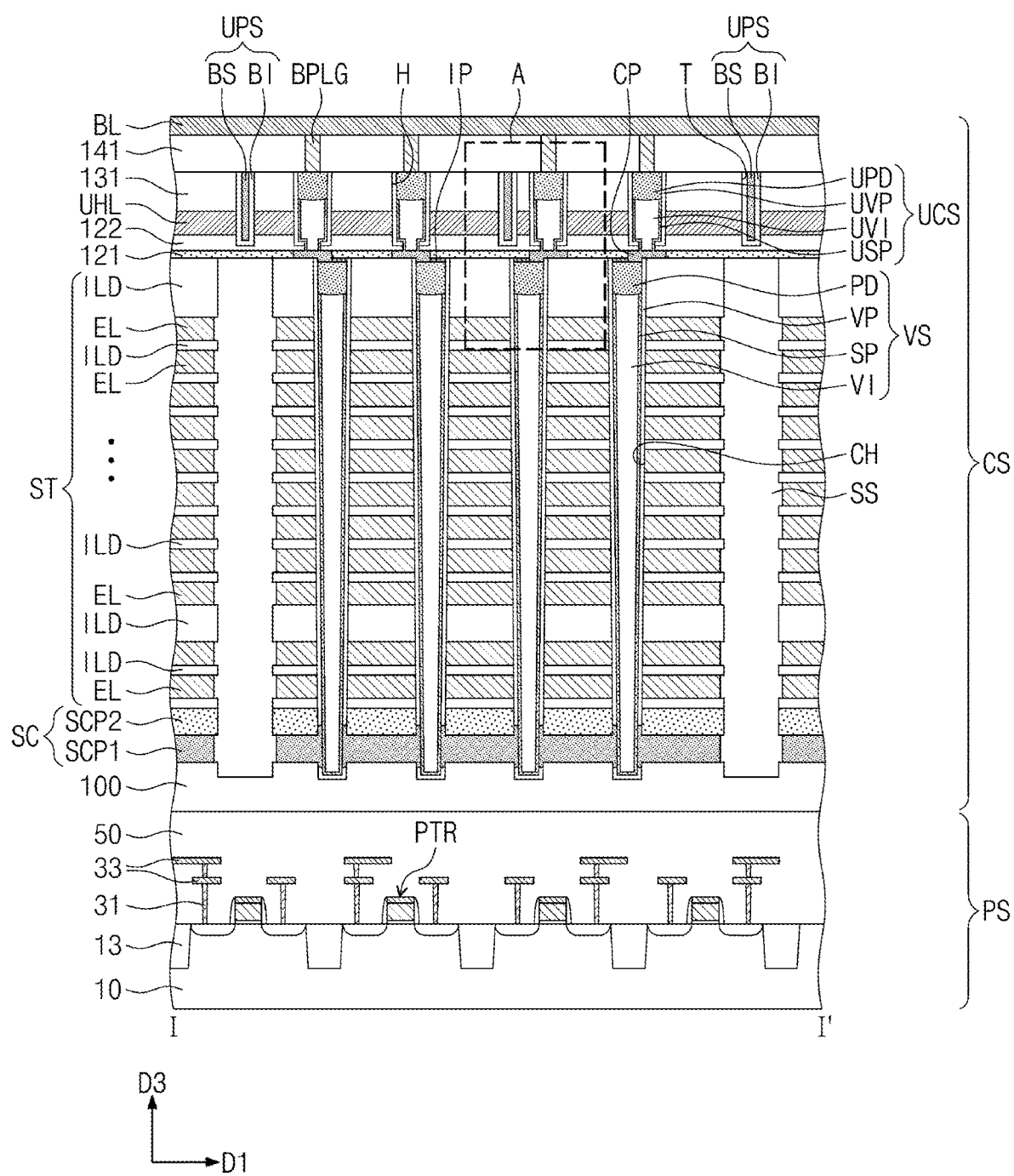
FIG. 7 is a sectional view taken along a line I-I' of FIG. 6 to illustrate a semiconductor device according to an embodiment of the inventive concept.
Figure 8:
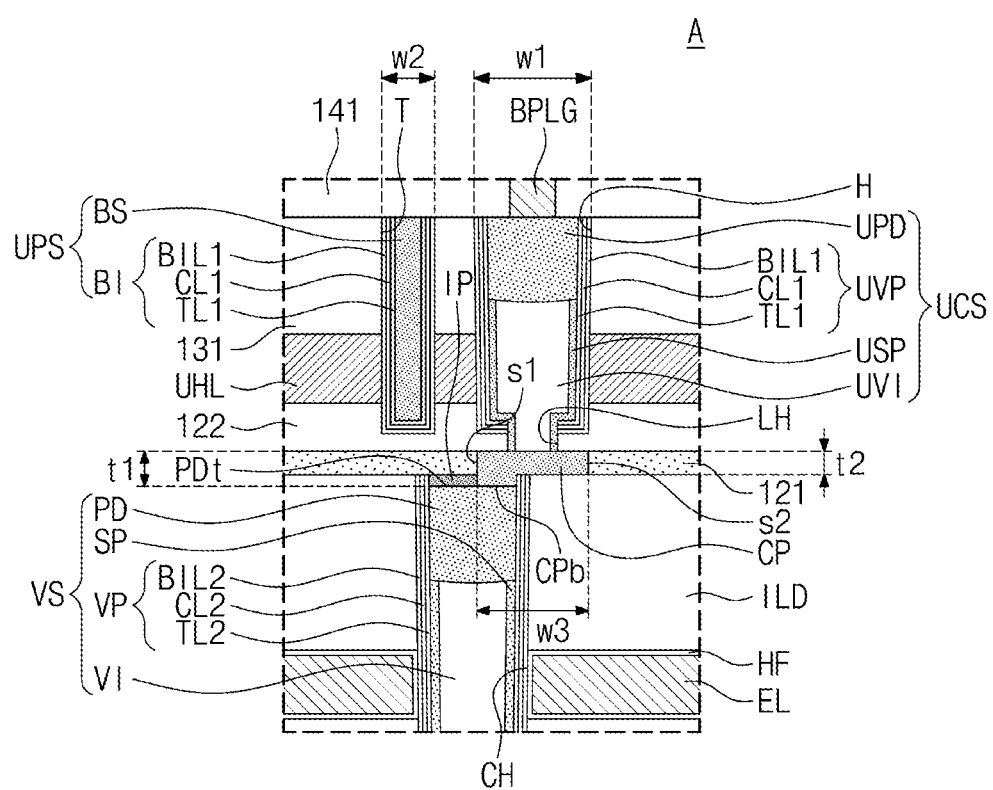
FIG. 8 is an enlarged sectional view illustrating a portion 'A' of FIG. 7.

FIG. 6 is an enlarged plan view illustrating a portion of a cell array region of a semiconductor device according to an embodiment of the inventive concept. FIG. 7 is a sectional view taken along a line I-I' of FIG. 6 to illustrate a semiconductor device according to an embodiment of the inventive concept. FIG. 8 is an enlarged sectional view illustrating a portion 'A' of FIG. 7.

Referring to FIGS. 5 to 7, a peripheral circuit structure PS including a substrate 10 and peripheral transistors PTR may be provided. A cell array structure CS including an electrode structure ST may be disposed on the peripheral circuit structure PS. The substrate 10 may be a silicon substrate, a silicon-germanium substrate, a germanium substrate, or a single-crystalline epitaxial layer grown on a single-crystalline silicon substrate. The substrate 10 may include active regions, which are defined by a device isolation layer 13. The peripheral transistors PTR may be used as a part of the decoder circuit, the page buffer, and/or the logic circuit described with reference to FIG. 1.

The peripheral circuit structure PS may include lower interconnection lines 33, which are provided on the peripheral transistors PTR, and a lower insulating layer 50, which is provided to cover the peripheral transistors PTR and the lower interconnection lines 33. A peripheral contact 31 may be provided between the lower interconnection lines 33 and the peripheral transistor PTR. The peripheral contact 31 may be provided to electrically connect the peripheral transistors PTR to the lower interconnection lines 33. The lower insulating layer 50 may include a plurality of vertically-stacked insulating layers. For example, the lower insulating layer 50 may include at least one of a silicon oxide layer, a silicon nitride layer, a silicon oxynitride layer, and/or a low-k dielectric layer.

The cell array structure CS may be disposed on the lower insulating layer 50. The cell array structure CS may include a lower semiconductor layer 100, a source structure SC, the electrode structure ST, and a vertical structures VS. The cell array structure CS may include the memory cell strings CSTR described with reference to FIG. 1. The memory cell strings CSTR may include the electrode structure ST and the vertical structures VS.

The lower semiconductor layer 100 may be disposed on a top surface of the lower insulating layer 50. The lower semiconductor layer 100 may be formed of or include at least one of, for example, semiconductor materials (e.g., silicon (Si), germanium (Ge), silicon germanium (SiGe), gallium arsenic (GaAs), indium gallium arsenic (InGaAs), aluminum gallium arsenic (AlGaAs), or compounds thereof). The lower semiconductor layer 100 may be formed of or include a doped semiconductor material of a first conductivity type and/or an undoped intrinsic semiconductor material. The first conductivity type may be, for example, an n-type. The lower semiconductor layer 100 may have at least one of crystal structures (e.g., single crystalline, amorphous, and polycrystalline structures). The lower semiconductor layer 100 may have a top surface that extends in a first direction D1 and a second direction D2, which are perpendicular to each other.

The source structure SC may be disposed between the electrode structure ST and the lower semiconductor layer 100. The source structure SC may be parallel to a top surface of the lower semiconductor layer 100 and may extend parallel to the electrode structure ST or in the first and second directions D1 and D2. The source structure SC may include a first horizontal pattern SCP1 and a second horizontal pattern SCP2 on the first horizontal pattern SCP1. The first horizontal pattern SCP1 and the second horizontal pattern SCP2 may be sequentially stacked on the lower semiconductor layer 100. Each of the first and second horizontal patterns SCP1 and SCP2 may be formed of or include at least one of doped semiconductor materials having the first conductivity type. For example, the first and second horizontal patterns SCP1 and SCP2 may be formed of or include a semiconductor material that is doped with n-type dopants. The dopants may include, for example, phosphorus (P) or arsenic (As). In an embodiment, a concentration of n-type dopants in the first horizontal pattern SCP1 may be higher than that of the second horizontal pattern SCP2.

The electrode structure ST may be disposed on the lower semiconductor layer 100. The electrode structure ST may be placed between separation structures SS, which are extended in the second direction D2 and parallel to each other. The electrode structure ST may be spaced apart from the lower semiconductor layer 100 by the source structure SC interposed therebetween. The electrode structure ST may extend in the second direction D2 from a cell array region CAR to a connection region CNR.

The electrode structure ST may include electrodes EL and insulating patterns ILD, which are alternately stacked in a direction perpendicular to the top surface of the lower semiconductor layer 100 (i.e., in a third direction). The electrodes EL and the insulating patterns ILD may be placed between a pair of the separation structures SS, which are adjacent to each other in the first direction D1. The lowermost one or two of the electrodes EL of the electrode structure ST may be used as a lower selection line. The remaining ones of the electrodes EL excluding the lower selection line may be used as word lines. The electrodes EL may have substantially the same thickness, and the insulating patterns ILD may have at least two different thicknesses, depending on desired characteristics of the semiconductor device. For example, the insulating pattern ILD between the lower selection line and the word line may be thicker than the insulating patterns ILD between the word lines. One of the insulating patterns ILD, which is disposed on the top surface of the uppermost electrode EL, may be thicker than the others of the insulating patterns ILD. Each of the electrodes EL may be formed of or include at least one of doped semiconductor materials (e.g., doped silicon), metallic materials (e.g., tungsten, copper, or aluminum), conductive metal nitrides (e.g., titanium nitride or tantalum nitride), or transition metals (e.g., titanium or tantalum). Each of the insulating patterns ILD may be formed of or include silicon oxide.

The electrode structure ST may have a stepwise structure on the connection region CNR. The stepwise structure of the electrode structure ST may have a decreasing thickness with increasing distance from the cell array region CAR. The stepwise structure of the electrode structure ST may define pad portions on the connection region CNR. The pad portions may be portions of the electrodes EL. A portion of the electrode EL serving as the pad portion may not be veiled or covered by the electrode EL thereon. The pad portion may be used to connect each of the electrodes EL to the peripheral circuit structure PS. The pad portions may be coupled to cell contact plugs CPLG. Each of the pad portions may be coupled to one of the cell contact plugs CPLG.

The vertical structures VS may be provided on the cell array region CAR to penetrate the electrode structure ST. The vertical structures VS may be arranged in the first and second directions D1 and D2. For example, as shown in FIG. 6, four vertical structures VS1, VS3, VS5, and VS7 may be arranged in the first direction D1 to form a first column C1, and four other vertical structures VS2, VS4, VS6, and VS8 may be arranged in the first direction D1 to form a second column C2. The first and second columns C1 and C2 may be alternately and repeatedly arranged in the second direction D2. The number of the vertical structures VS in the first column C1 may be equal to the number of the vertical structures VS in the second column C2. The vertical structures VS may be arranged in each of the first and second columns C1 and C2 to be spaced apart from each other by a constant or uniform distance in the first direction D1. The vertical structures VS1, VS3, VS5, and VS7 of the first column C1 may be arranged in a zigzag shape with respect to the vertical structures VS2, VS4, VS6, and VS8 of the second column C2. One of the vertical structures VS, which are placed in the first column C1, may be vertically overlapped with a second upper separation pattern UPS2 to be described below. One of the vertical structures VS, which are placed in the second column C2, may be vertically overlapped with the second upper separation pattern UPS2.

Each of the vertical structures VS may be provided in channel holes CH, which are formed to penetrate the electrode structure ST. Top surfaces of the vertical structures VS may be located at the same level (e.g., relative to the substrate 10) as a top surface of the uppermost one of the insulating patterns ILD of the electrode structure ST. Bottom surfaces of the vertical structures VS may be located closer to the substrate 10 at a level lower than the top surface of the lower semiconductor layer 100. A diameter of each of the vertical structures VS may gradually decrease with decreasing distance to the substrate 10.

Each of the vertical structures VS may include a vertical insulating pattern VP, a vertical semiconductor pattern SP, a gapfill insulating pattern VI, and a conductive pad PD. The vertical insulating pattern VP, the vertical semiconductor pattern SP, and the gapfill insulating pattern VI may be sequentially provided on an inner side surface of the channel hole CH. The conductive pad PD may be provided on the gapfill insulating pattern VI and the vertical semiconductor pattern SP.

The vertical semiconductor pattern SP may be interposed between the vertical insulating pattern VP and the gapfill insulating pattern VI. The vertical semiconductor pattern SP may be shaped like a pipe with an open top end. The vertical semiconductor pattern SP may be spaced apart from the electrodes EL with the vertical insulating pattern VP interposed therebetween. The vertical semiconductor pattern SP may be formed of or include at least one of semiconductor materials (e.g., silicon (Si), germanium (Ge), or compounds thereof). In addition, the vertical semiconductor pattern SP may be formed of or include a doped semiconductor material or an undoped intrinsic semiconductor material. The vertical semiconductor pattern SP may be used as channel regions of transistors constituting a NAND cell string.

The gapfill insulating pattern VI may be provided to cover an inner surface of the vertical semiconductor pattern SP. The gapfill insulating pattern VI may be spaced apart from the vertical insulating pattern VP with the vertical semiconductor pattern SP interposed therebetween. The gapfill insulating pattern VI may be shaped like a circular pillar.

The vertical insulating pattern VP may be provided to enclose the vertical semiconductor pattern SP. The vertical insulating pattern VP may be provided to cover an outer surface of the vertical semiconductor pattern SP. The vertical insulating pattern VP may be shaped like a pipe with an open top end. The vertical insulating pattern VP may consist of a single thin film or a plurality of thin films.

In detail, referring to FIG. 8, the vertical insulating pattern VP may include a data storing layer. In an embodiment, the vertical insulating pattern VP may include a tunnel insulating layer TL2, a charge storing layer CL2, and a blocking insulating layer BIL2, which are used as a data storing layer of a NAND FLASH memory device.

The charge storing layer CL2 may be a trap insulating layer, a floating gate electrode, or an insulating layer including conductive nanodots. The charge storing layer CL2 may include at least one of a silicon nitride layer, a silicon oxynitride layer, a silicon-rich nitride layer, a nanocrystalline silicon layer, and a laminated trap layer. The tunnel insulating layer TL2 may be formed of or include a material whose band gap larger is larger than the charge storing layer. The tunnel insulating layer TL2 may include a high-k dielectric layer (e.g., an aluminum oxide layer and a hafnium oxide layer) or a silicon oxide layer. The blocking insulating layer BIL2 may include a silicon oxide layer and/or an aluminum oxide layer.

The conductive pad PD may be provided to cover a top surface of the vertical semiconductor pattern SP and a top surface of the gapfill insulating pattern VI. The conductive pad PD may be formed of or include at least one of doped semiconductor materials and/or metallic materials.

An electrode barrier layer HF may be provided between the electrodes EL and the insulating patterns ILD. The electrode barrier layer HF may extend into regions between the electrodes EL and the vertical structures VS. The electrode barrier layer HF may be formed of or include at least one of metal nitrides (e.g., titanium nitride, tantalum nitride, and tungsten nitride). The electrode barrier layer HF may further include a transition metal layer (e.g., titanium or tantalum), in addition to the layer of metal nitride. In an embodiment, the electrode barrier layer HF may include a high-k metal oxide layer (e.g., an aluminum oxide layer or a hafnium oxide layer).

Referring back to FIGS. 5 to 7, dummy structures DS may be provided on the connection region CNR. The dummy structures DS may be provided to penetrate the stepwise structure of the electrode structure ST. The dummy structures DS may be formed, when the vertical structures VS are formed, and may have a similar structure to the vertical structures VS. The dummy structures DS may not be used as the channel regions of the memory cell transistors, unlike the vertical structures VS. The dummy structures DS may not be electrically connected to the bit lines BL to be described below. That is, the dummy structures DS may not have any function in terms of circuitry. The dummy structures DS may be used as a pillar (i.e., a supporter) of mechanically supporting the stepwise structure of the electrode structure ST. When viewed in a plan view, a size (e.g., the largest diameter) of each of the dummy structures DS may be larger than a size (e.g., the largest diameter) of each of the vertical structures VS.

The separation structures SS may be provided to cross the electrode structures ST. The separation structures SS may be spaced apart from each other in the first direction D1 and may extend in the second direction D2 and parallel to each other. The separation structures SS may extend from the cell array region CAR to the connection region CNR to fully cross the electrode structure ST. A pair of the separation structures SS, which are adjacent to each other in the first direction D1, may separate the electrodes EL in each electrode structure ST from the electrodes EL in neighboring electrode structures ST. In addition, the adjacent pair of the separation structures SS may separate the source structure SC in each electrode structure ST from the source structures SC in neighboring electrode structures ST. Each of the separation structures SS may have a line shape or a bar shape. The separation structures SS may be formed of or include at least one of insulating materials. For example, the separation structures SS may be formed of or include silicon oxide.

Top surfaces of the separation structures SS may be located at the same level as the top surface of the uppermost one of the insulating patterns ILD of the electrode structure ST. The top surfaces of the separation structures SS may be coplanar with the top surface of the uppermost one of the insulating patterns ILD of the electrode structure ST. Bottom surfaces of the separation structures SS may be located at a level lower than the top surface of the lower semiconductor layer 100. The separation structures SS may have protruding portions that extend toward side surfaces of the electrodes EL. Each of the protruding portions may be interposed between two adjacent ones of the insulating patterns ILD.

Partial separation structures PSS may be provided between the separation structures SS. The partial separation structures PSS may be provided on the connection region CNR and may extend in the second direction D2. The partial separation structures PSS may not cross the entirety of the electrode structure ST, unlike the separation structures SS. Each of the partial separation structures PSS may be a line- or bar-shaped pattern which is shorter than the separation structures SS. The partial separation structures PSS may be formed, when the separation structures SS are formed, and may be formed of or include the same material as the separation structures SS.

Referring to FIGS. 7 and 8, a first insulating layer 121 may be disposed on the electrode structure ST. The first insulating layer 121 may be placed on the top surface of the uppermost one of the insulating patterns ILD of the electrode structure ST. The first insulating layer 121 may cover the vertical structures VS and the separation structures SS. The first insulating layer 121 may be formed of or include at least one of materials having an etch selectivity with respect to the insulating patterns ILD. For example, the first insulating layer 121 may be formed of or include silicon nitride. A thickness of the first insulating layer 121 may be smaller than a thickness of the uppermost one of the insulating patterns ILD.

Capping patterns IP may be provided between the first insulating layer 121 and the pads PD of the vertical structures VS. A top surface of the capping pattern IP may be located at the same level as the top surface of the uppermost one of the insulating patterns ILD of the electrode structure ST. In addition, the top surface of the capping pattern IP may be located at the same level as a top surface of the vertical insulating pattern VP. A side surface of the capping pattern IP may face an inner side surface of the vertical insulating pattern VP. An opposite side surface of the capping pattern IP may face a first side surface s1 of a conductive pattern CP, which will be described below. The capping pattern IP may have a thickness that is smaller than the first insulating layer 121. The capping pattern IP may be formed of or include at least one of materials having an etch selectivity with respect to the first insulating layer 121. For example, the capping pattern IP may be formed of or include silicon oxide.

A second insulating layer 122 may be disposed on a top surface of the first insulating layer 121. The second insulating layer 122 may have a thickness larger than the first insulating layer 121. A thickness of the second insulating layer 122 may be smaller than a thickness of the uppermost one of the insulating patterns ILD. The second insulating layer 122 may be formed of or include at least one of materials having an etch selectivity with respect to the first insulating layer 121. For example, the second insulating layer 122 may be formed of or include silicon oxide. The second insulating layer 122 may not be in contact with the pads PD of the vertical structures VS. The second insulating layer 122 may be spaced apart from the vertical structures VS with the first insulating layer 121 interposed therebetween.

The conductive pattern CP may be provided between the second insulating layer 122 and the vertical structures VS and between the second insulating layer 122 and the insulating pattern ILD. The conductive pattern CP may be partially overlapped with the vertical structure VS. In other words, the conductive pattern CP may not be overlapped with the entire portion of the vertical structure VS. A center of the conductive pattern CP may be spaced apart from a center of the vertical structure VS, when viewed in a horizontal direction. The conductive pattern CP may be provided to penetrate the first insulating layer 121 and may be connected to the vertical structure VS. As used herein, the term "connected" may refer to electrical and/or physical connection. A lower portion of the conductive pattern CP may be provided to penetrate the capping pattern IP and may be connected to the conductive pad PD of the vertical structure VS. The capping pattern IP may cover a portion of a top surface of the conductive pad PD. The conductive pattern CP may cover another portion of the top surface of the conductive pad PD. The conductive pattern CP may have side surfaces s1 and s2, which face the first insulating layer 121. A top surface of the conductive pattern CP may be partially covered with the second insulating layer 122. The conductive pattern CP may be formed of or include at least one of semiconductor materials (e.g., silicon (Si), germanium (Ge), or compounds thereof). In an embodiment, the conductive pattern CP may be formed of or include at least one of doped semiconductor materials. The conductive pattern CP will be described in more detail with reference to FIGS. 8 and 9.

Referring back to FIGS. 5 to 7, an upper horizontal electrode UHL may be provided on the second insulating layer 122. The upper horizontal electrode UHL may be partially overlapped with the electrode structures ST. The upper horizontal electrode UHL may be located on the cell array region CAR. In an embodiment, the upper horizontal electrode UHL may extend to the connection region CNR and may be placed on some of the dummy structures DS. The upper horizontal electrode UHL may not cover the entirety of the connection region CNR. That is, the others of the dummy structures DS, portions of the electrodes EL, and portions of the separation structures SS may not be overlapped with the upper horizontal electrode UHL. The upper horizontal electrode UHL may be divided into a plurality of upper horizontal electrodes UHL by an upper separation pattern UPS. The upper horizontal electrodes UHL may be spaced apart from each other in the first direction D1, with the upper separation pattern UPS interposed therebetween. Each of the upper horizontal electrodes UHL may include a string selection line. For example, each of the upper horizontal electrodes UHL may be at least one of the upper transistors UT1 and UT2 described with reference to FIG. 1.

The upper horizontal electrodes UHL may be vertically spaced apart from the vertical structures VS with the first and second insulating layers 121 and 122 interposed therebetween. In other words, a bottom surface of the upper horizontal electrode UHL may be located at a level higher than the top surfaces of the vertical structures VS. The upper horizontal electrode UHL may have a thickness larger than each of the first and second insulating layers 121 and 122. The upper horizontal electrode UHL may be formed of or include at least one of conductive materials. The upper horizontal electrode UHL may be formed of or include at least one of doped semiconductor materials (e.g., doped silicon), metallic materials (e.g., tungsten, copper or aluminum), conductive metal nitrides (e.g., titanium nitride or tantalum nitride), or transition metals (e.g., titanium or tantalum).

A first interlayer insulating layer 131 and a second interlayer insulating layer 141 may be sequentially stacked on the upper horizontal electrode UHL. The first and second interlayer insulating layers 131 and 141 may be formed of or include at least one of, for example, silicon oxide, silicon nitride, or silicon oxynitride. In an embodiment, the first and second interlayer insulating layers 131 and 141 may be connected to each other to form a single object or unitary layer. That is, there may be no observable interface between the first and second interlayer insulating layers 131 and 141.

Referring to FIGS. 5 to 8, an upper channel structure UCS may be provided to penetrate the upper horizontal electrode UHL and the first interlayer insulating layer 131 and may be connected to the conductive pattern CP. The upper channel structure UCS may be provided in an upper hole H, which is formed to penetrate the upper horizontal electrode UHL and the first interlayer insulating layer 131. An inner side surfaces of the upper hole H may be defined by the second insulating layer 122, the upper horizontal electrode UHL, and the first interlayer insulating layer 131. A bottom of the upper hole H may be defined by the second insulating layer 122. That is, the bottom of the upper hole H may be located at a level lower than the bottom surface of the upper horizontal electrode UHL. The upper channel structure UCS may extend to a level lower than the bottom of the upper hole H and may be in contact with the top surface of the conductive pattern CP. A top surface of the upper channel structure UCS may be covered with the second interlayer insulating layer 141.

The upper channel structure UCS may include an upper insulating pattern UVP, an upper semiconductor pattern USP, an upper gapfill insulating pattern UVI, and an upper conductive pad UPD. The upper insulating pattern UVP, the upper semiconductor pattern USP, and the upper gapfill insulating pattern UVI may be sequentially provided on the inner side surface of the upper hole H. The conductive pad PD may be provided on the upper gapfill insulating pattern UVI and the upper semiconductor pattern USP.

The upper semiconductor pattern USP may be interposed between the upper insulating pattern UVP and the upper gapfill insulating pattern UVI. The upper semiconductor pattern USP may be shaped like a pipe with an open top end. The upper semiconductor pattern USP may be spaced apart from the upper horizontal electrode UHL with the upper insulating pattern UVP interposed therebetween. The upper semiconductor pattern USP may be formed of or include at least one of semiconductor materials (e.g., silicon (Si), germanium (Ge), or compounds thereof). In addition, the upper semiconductor pattern USP may be formed of or include at least one of doped semiconductor materials or undoped intrinsic semiconductor materials. The upper semiconductor pattern USP may extend to a level lower than the bottom of the upper hole H and may be in contact with the top surface of the conductive pattern CP. In detail, a lower hole LH, which has a width smaller than the upper hole H, may be formed between the bottom of the upper hole H and the conductive pattern CP. The lower hole LH may have an inner side surface defined by the second insulating layer 122. The upper semiconductor pattern USP may extend from an inner space of the upper hole H to an inner space of the lower hole LH. The upper semiconductor pattern USP may cover the inner side surface of the lower hole LH. That is, the upper semiconductor pattern USP may be in contact with the second insulating layer 122. In an embodiment, the upper semiconductor pattern USP and the conductive pattern CP may be connected to form a single object or unitary structure. In an embodiment, the upper semiconductor pattern USP and the conductive pattern CP may be formed through the same process, and there may be no interface between the upper semiconductor pattern USP and the conductive pattern CP. The upper semiconductor pattern USP and the conductive pattern CP may be formed of or include the same material as the separation structures SS.

The upper gapfill insulating pattern UVI may be spaced apart from the upper insulating pattern UVP with the upper semiconductor pattern USP interposed therebetween. The upper gapfill insulating pattern UVI may be provided to cover an inner side surface of the upper semiconductor pattern USP. The upper gapfill insulating pattern UVI may have a circular pillar shape. The upper gapfill insulating pattern UVI may extend from the inner space of the upper hole H to the inner space of the lower hole LH. The upper gapfill insulating pattern UVI may cover a portion of the top surface of the conductive pattern CP.

The upper insulating pattern UVP may be provided to cover an outer surface of the upper semiconductor pattern USP. The upper insulating pattern UVP may be shaped like a pipe with an open top end. The upper insulating pattern UVP may consist of a single thin film or a plurality of thin films.

In detail, referring to FIG. 8, the upper insulating pattern UVP may include an upper tunnel insulating layer TL1, an upper charge storing layer CL1, and an upper blocking insulating layer BIL1.

The upper charge storing layer CL1 may be a trap insulating layer, a floating gate electrode, or an insulating layer including conductive nanodots. The upper charge storing layer CL1 may include at least one of a silicon nitride layer, a silicon oxynitride layer, a silicon-rich nitride layer, a nanocrystalline silicon layer, and a laminated trap layer. The upper tunnel insulating layer TL1 may be formed of or include a material whose band gap larger is larger than the upper charge storing layer CL1. The upper tunnel insulating layer TL1 may be formed of or include high-k dielectric materials (e.g., aluminum oxide and hafnium oxide) or silicon oxide. The upper blocking insulating layer BIL1 may include a silicon oxide layer and/or an aluminum oxide layer.

The upper conductive pad UPD may cover the top surface of the upper semiconductor pattern USP and the top surface of the upper gapfill insulating pattern UVI. The upper conductive pad UPD may be formed of or include at least one of doped semiconductor materials and/or metallic materials.

Referring back to FIGS. 5 to 7, the upper separation patterns UPS may be provided to cross the upper horizontal electrode UHL in the second direction D2. The upper separation patterns UPS may divide the upper horizontal electrode UHL, which is provided on each of the electrode structures ST, into two electrodes, which are electrically separated from each other. Each of the upper separation patterns UPS may be provided in a trench T, which is formed to penetrate the upper horizontal electrode UHL and the first interlayer insulating layer 131. An inner side surfaces of the trench T may be defined by the second insulating layer 122, the upper horizontal electrode UHL, and the first interlayer insulating layer 131. A bottom surface of the trench T may be defined by the second insulating layer 122. The bottom surface of the trench T may be located at a level lower than the bottom surface of the upper horizontal electrode UHL. Top surfaces of the upper separation patterns UPS may be covered with the second interlayer insulating layer 141.

Lengths of the upper separation patterns UPS in the second direction D2 may not be shorter than that of the upper horizontal electrode UHL. The upper separation patterns UPS may be provided to fully cross the upper horizontal electrode UHL. The upper separation patterns UPS may include first upper separation patterns UPS1, which are overlapped with the separation structures SS, and a second upper separation pattern UPS2, which is provided between the first upper separation patterns UPS1, as shown in FIG. 6. The first upper separation patterns UPS1 may have a width, which is smaller than the separation structures SS, and may be fully overlapped with the separation structures SS. The second upper separation patterns UPS2 may be overlapped with the electrodes EL of the electrode structure ST and may not be overlapped with the separation structures SS. The second upper separation patterns UPS2 may be provided to cross a region between the vertical structures VS and may be partially overlapped with some of the vertical structures VS.

Each of the upper separation patterns UPS may include a barrier layer BI and a gapfill semiconductor pattern BS. The barrier layer BI may be provided on an inner surface of the trench T to enclose an outer side surface and a bottom surface of the gapfill semiconductor pattern BS. The gapfill semiconductor pattern BS may be buried in the barrier layer BI. The gapfill semiconductor pattern BS may be spaced apart from the upper horizontal electrode UHL with the barrier layer BI interposed therebetween.

Referring to FIG. 8, the barrier layer BI may have film properties similar to the upper insulating pattern UVP. For example, the barrier layer BI may include the upper tunnel insulating layer TL1, the upper charge storing layer CL1, and the upper blocking insulating layer BIL1. The gapfill semiconductor pattern BS may be formed of or include at least one of semiconductor materials (e.g., silicon (Si), germanium (Ge), or compounds thereof). In addition, the upper semiconductor pattern USP may be formed of or include at least one of doped semiconductor materials or undoped intrinsic semiconductor materials.

The upper separation pattern UPS may have a width w2 that is smaller than a width w1 of the upper channel structure UCS. For example, the width w2 of the upper separation pattern UPS may be 0.1 to 0.5 times the width w1 of the upper channel structure UCS. The width w2 of the upper separation pattern UPS may not be larger than two times a sum of thicknesses of the upper insulating pattern UVP and the upper semiconductor pattern USP. The width w2 of the upper separation pattern UPS may be smaller than a width W3 of the conductive pattern CP. In the present specification, a width of an element may mean a length of the element in the first direction D1, unless otherwise stated.

Figure 9:
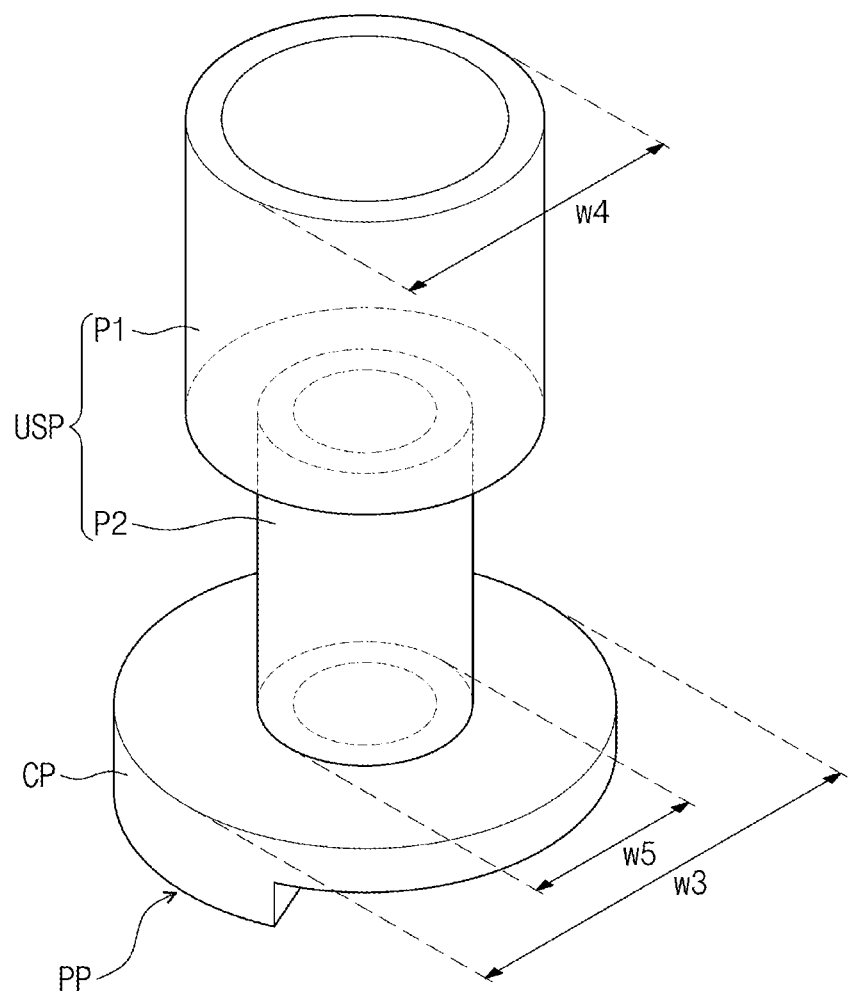
FIG. 9 is a perspective view illustrating a conductive pattern and an upper semiconductor pattern according to an embodiment of the inventive concept.

FIG. 9 is a perspective view illustrating a conductive pattern and an upper semiconductor pattern according to an embodiment of the inventive concept.

Referring to FIGS. 8 and 9, the upper semiconductor pattern USP may have a first portion P1 and a second portion P2, which is provided to connect the first portion P1 to the conductive pattern CP. The second portion P2 may be located between a bottom surface of the first portion P1 and a top surface of the conductive pattern CP. Here, the first portion P1, the second portion P2, and the conductive pattern CP may be concentric with each other. That is, geometric centers of the first portion P1, the second portion P2, and the conductive pattern CP may be aligned or placed on a single vertical straight line. Each of the first and second portions P1 and P2 may have a hollow cylindrical shape. The second portion P2 may have a width w5 that is smaller than a width w4 of the first portion P1. The width W3 of the conductive pattern CP may be larger than the largest width of the upper semiconductor pattern USP. For example, the width W3 of the conductive pattern CP may be larger than the width w4 of the first portion P1 and the width w5 of the second portion P2. Since the conductive pattern CP has a width larger than the largest width of the upper semiconductor pattern USP, the reliability in electric connection between the conductive pattern CP and the conductive pad PD may be improved.

The conductive pattern CP may have a first side surface s1 on the vertical structure VS and a second side surface s2 on the insulating pattern ILD. That is, the first side surface s1 may vertically overlap with the vertical structure VS, and the second side surface s2 may vertically overlap with the insulating pattern ILD. The first side surface s1 may be connected to a bottom end CPb of the conductive pattern CP and may be a surface that is opposite to the second side surface s2. A vertical length or thickness t1 of the first side surface s1 may be larger than a vertical length or thickness t2 of the second side surface s2. The first side surface s1 may be located on the conductive pad PD of the vertical structure VS. In other words, the conductive pad PD may be partially but not fully overlapped with the conductive pattern CP. The bottom end CPb of the conductive pattern CP may be located at a level lower (i.e., closer to the substrate 10) than the top surface of the insulating pattern ILD and the top surface of the vertical insulating pattern VP. The conductive pattern CP may have a protruding portion PP which protrudes a direction away from the upper semiconductor pattern USP (i.e., a direction toward the conductive pad PD). A portion of the conductive pattern CP having the protruding portion PP may have the largest thickness t1, and another portion of the conductive pattern CP overlapped with the insulating pattern ILD may have the smallest thickness t2, with a step difference therebetween. The first side surface s1 may be connected to the protruding portion PP.

Referring back to FIGS. 5 to 7, the bit lines BL may be provided on the second interlayer insulating layer 141. Contact plugs BPLG may be provided to penetrate the second interlayer insulating layer 141 and may be coupled to the upper conductive pads UPD, respectively. The bit lines BL may extend in the first direction D1 and parallel to each other. The bit lines BL may be electrically connected to the upper channel structures UCS, respectively, through the contact plugs BPLG.

The cell contact plugs CPLG may be respectively coupled to the electrodes EL constituting the stepwise structure. Some of the cell contact plugs CPLG may be coupled to the upper horizontal electrodes UHL. The electrodes EL and the upper horizontal electrodes UHL may be electrically connected to the peripheral circuit structure PS through the cell contact plugs CPLG.

Figure 10A:
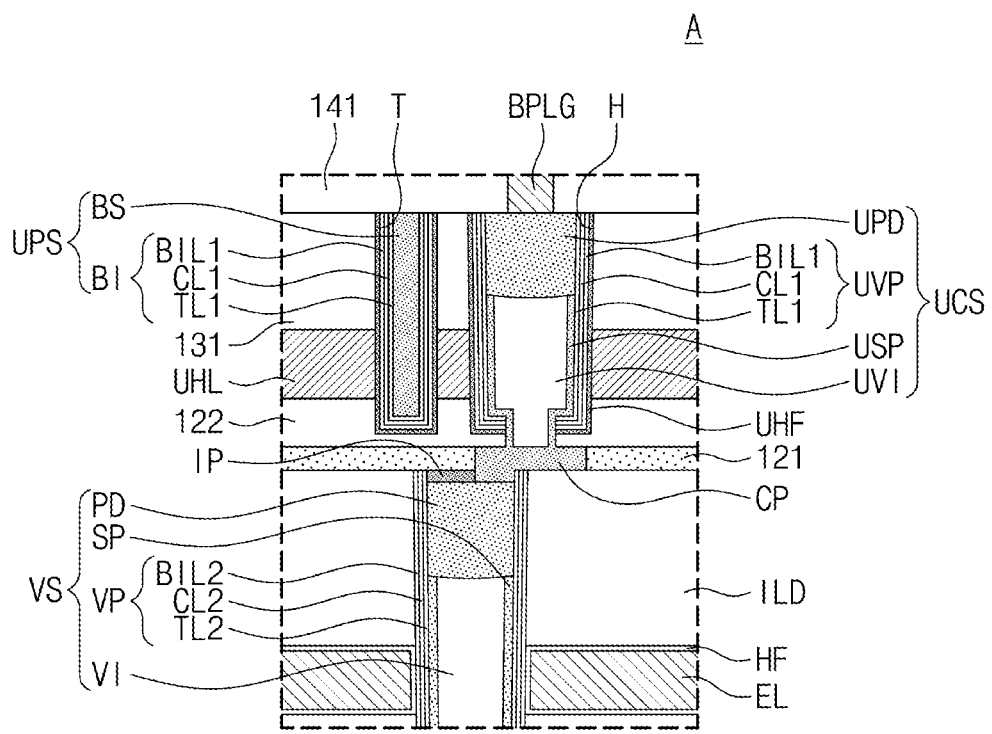
FIGS. 10A and 10B are enlarged sectional views illustrating a portion (e.g., the portion 'A' of FIG. 7) of a semiconductor device according to an embodiment of the inventive concept.
Figure 10B:
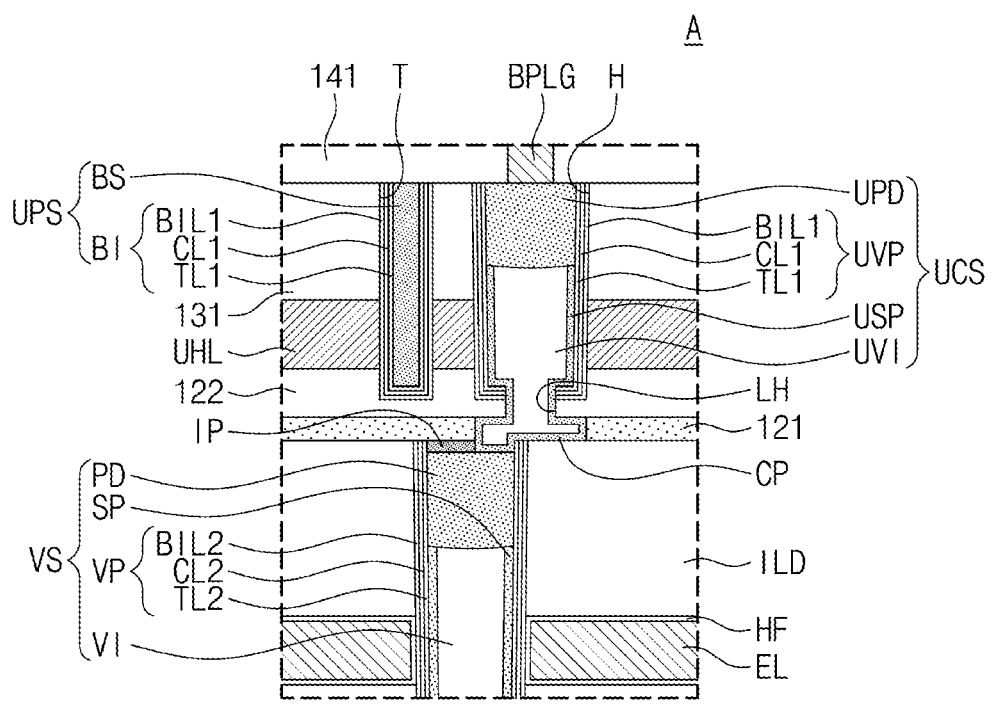

FIGS. 10A and 10B are enlarged sectional views illustrating a portion (e.g., the portion 'A' of FIG. 7) of a semiconductor device according to an embodiment of the inventive concept. For concise description, a previously described element may be identified by the same reference number without repeating an overlapping description thereof.

Referring to FIG. 10A, an upper barrier layer UHF may be provided in the upper hole H and the trench T. The upper barrier layer UHF may be provided to enclose outer side surfaces of the upper channel structure UCS in the upper hole H. The upper barrier layer UHF may enclose the upper separation pattern UPS in the trench T. In an embodiment, the upper barrier layer UHF may be formed of or include at least one metal nitride (e.g., titanium nitride, tantalum nitride, tungsten nitride). The electrode barrier layer HF may further include a transition metal layer (e.g., titanium or tantalum), in addition to the layer of metal nitride. In an embodiment, the electrode barrier layer HF may include a high-k metal oxide layer (e.g., an aluminum oxide layer or a hafnium oxide layer).

Referring to FIG. 10B, the conductive pattern CP may be provided to partially but not fully fill a space formed between top and bottom surfaces of the first insulating layer 121. The conductive pattern CP may conformally cover surfaces of the first insulating layer 121, the second insulating layer 122, the conductive pad PD, and the insulating pattern ILD. In an embodiment, the conductive pattern CP may have substantially the same thickness as the upper semiconductor pattern USP and may be formed of or include the same material as the upper semiconductor pattern USP. The upper gapfill insulating pattern UVI may extend to a region below the top surface of the first insulating layer 121 to fill the space formed between the top and bottom surfaces of the first insulating layer 121. The upper gapfill insulating pattern UVI may cover an inner surface of the conductive pattern CP.

Figure 11A:
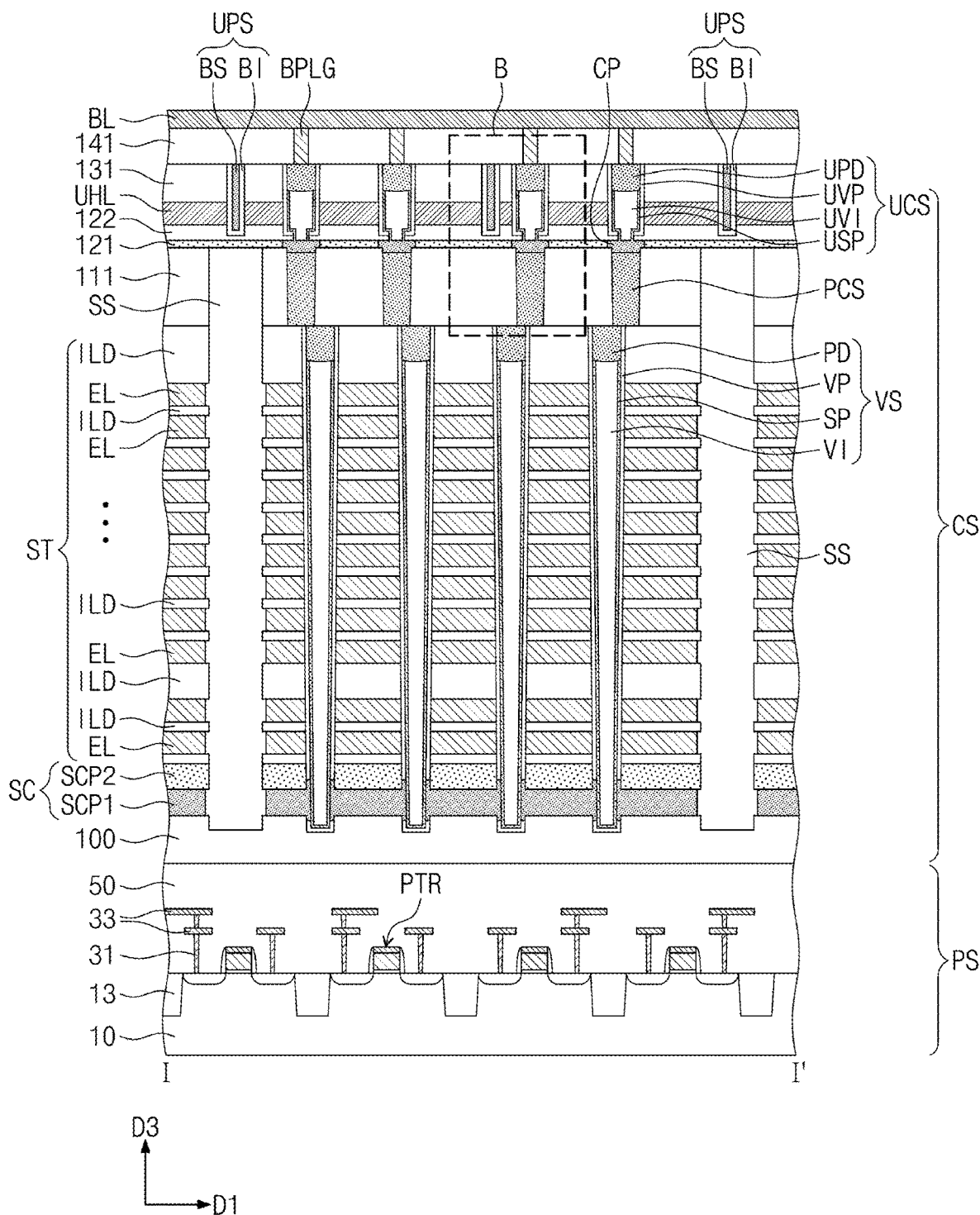
FIGS. 11A and 12A are sectional views, which are respectively taken along the line I-I' of FIG. 6 to illustrate a semiconductor device according to an embodiment of the inventive concept.
Figure 11B:
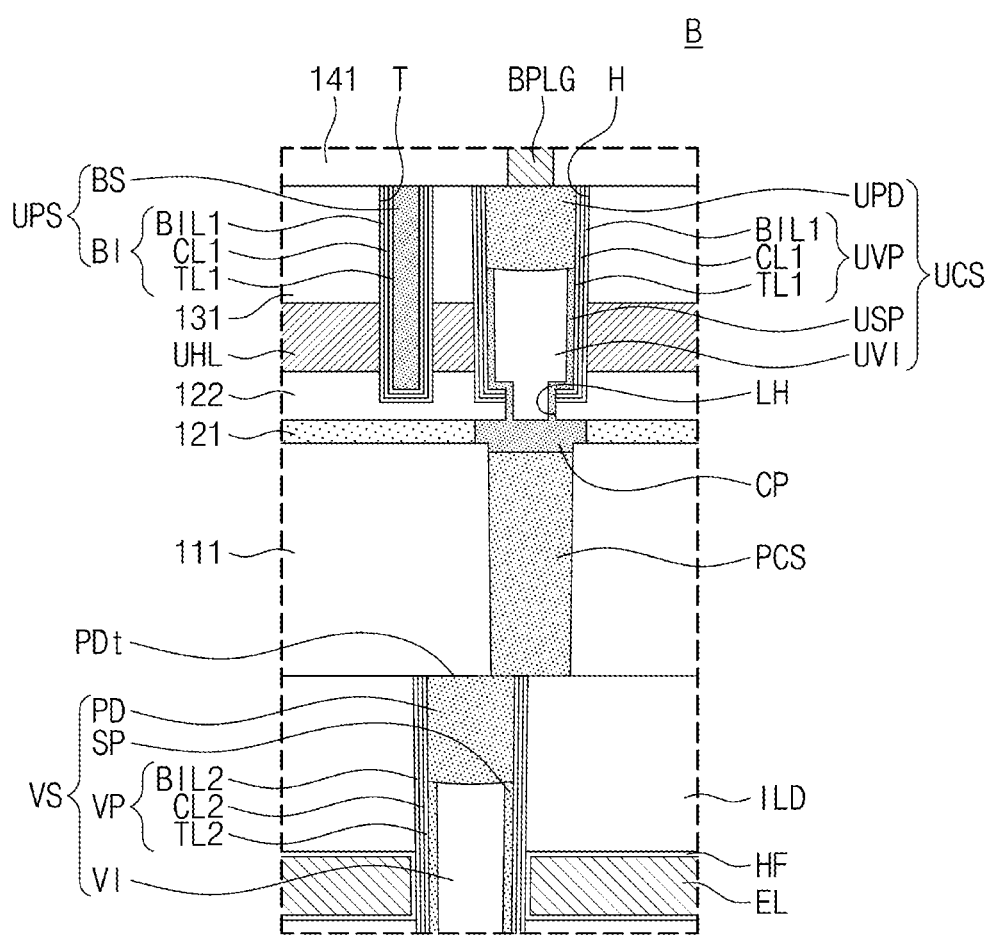
FIG. 11B is an enlarged sectional view illustrating a portion 'B' of FIG. 11A.
Figure 12A:
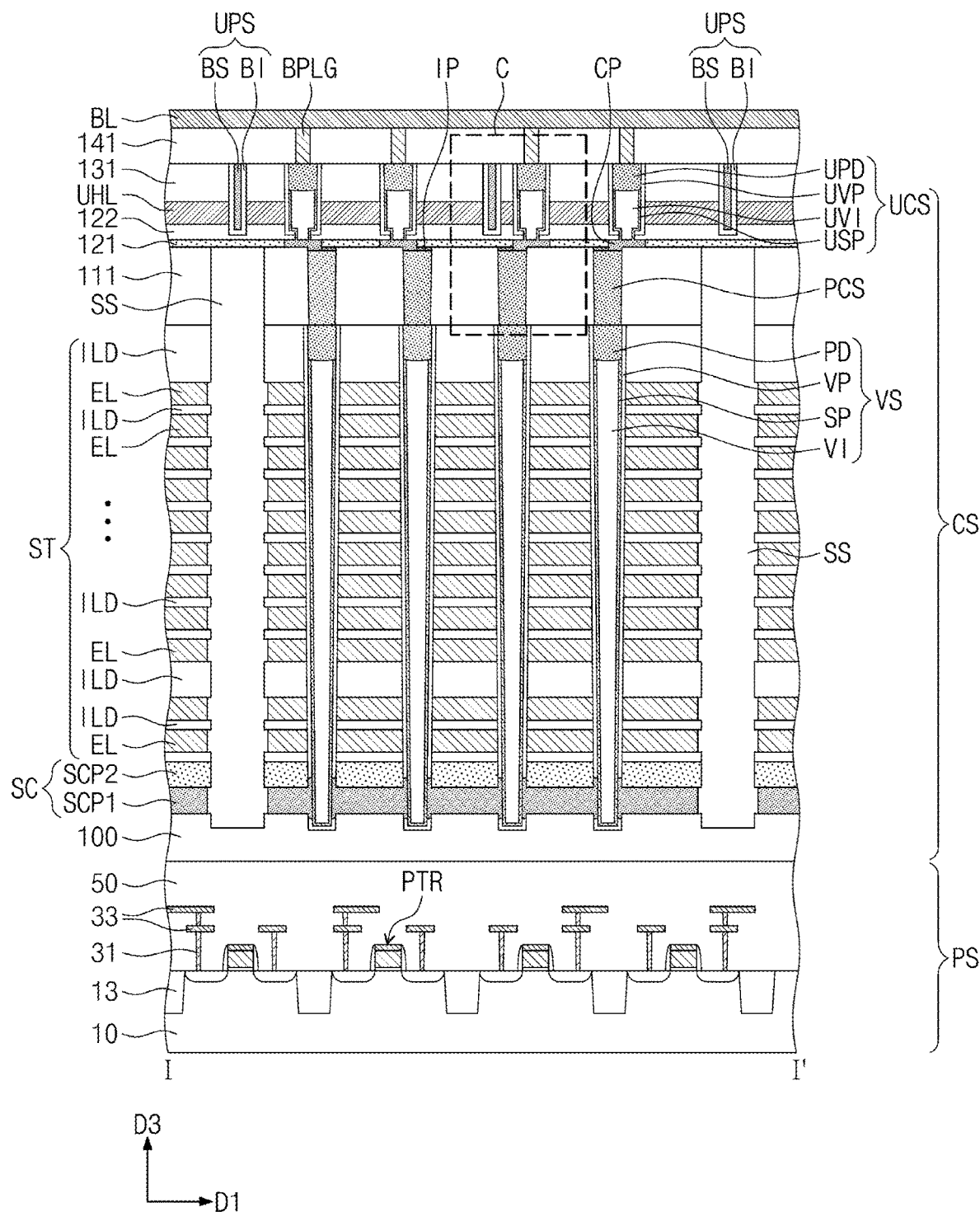
Figure 12B:
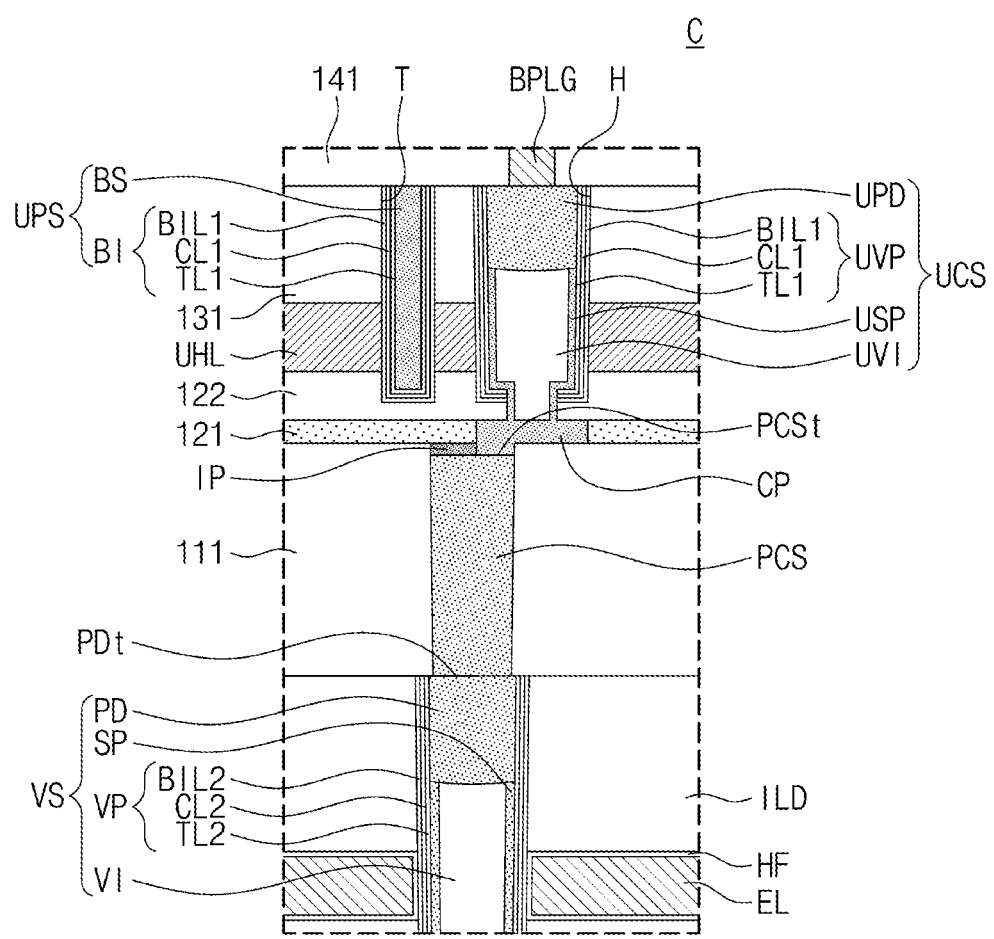
FIG. 12B is an enlarged sectional view illustrating a portion 'C' of FIG. 12A.

FIGS. 11A and 12A are sectional views, which are respectively taken along the line I-I' of FIG. 6 to illustrate a semiconductor device according to an embodiment of the inventive concept. FIG. 11B is an enlarged sectional view illustrating a portion 'B' of FIG. 11A. FIG. 12B is an enlarged sectional view illustrating a portion 'C' of FIG. 12A. For concise description, a previously described element may be identified by the same reference number without repeating an overlapping description thereof.

Referring to FIGS. 11A and 11B, a lower interlayer insulating layer 111 may be formed between the first insulating layer 121 and the electrode structure ST. The conductive pattern CP may be vertically spaced apart from the conductive pad PD of the vertical structure VS by the lower interlayer insulating layer 111. The lower interlayer insulating layer 111 may be formed of or include at least one of materials having an etch selectivity with respect to the first insulating layer 121. For example, the lower interlayer insulating layer 111 may be formed of or include silicon oxide.

A connection pattern PCS may be provided in the lower interlayer insulating layer 111. The connection pattern PCS may be provided to penetrate the lower interlayer insulating layer 111 and to connect the conductive pattern CP to the conductive pad PD. The connection pattern PCS may be formed of or include at least one of semiconductor materials (e.g., silicon (Si), germanium (Ge), or compounds thereof).

For example, the connection pattern PCS may be formed of or include a doped semiconductor material. The conductive pattern CP may extend to a top surface of the connection pattern PCS and may have a bottom surface, which is located at a level lower than a top surface of the lower interlayer insulating layer 111.

Referring to FIGS. 12A and 12B, the conductive pattern CP may be partially but not fully overlapped with the connection pattern PCS. The capping pattern IP may be provided on a top surface PCSt of the connection pattern PCS, not on a top surface PDt of the conductive pad PD. The conductive pattern CP may extend to penetrate the capping pattern IP and to be in contact with the top surface PCSt of the connection pattern PCS.

Figure 13:
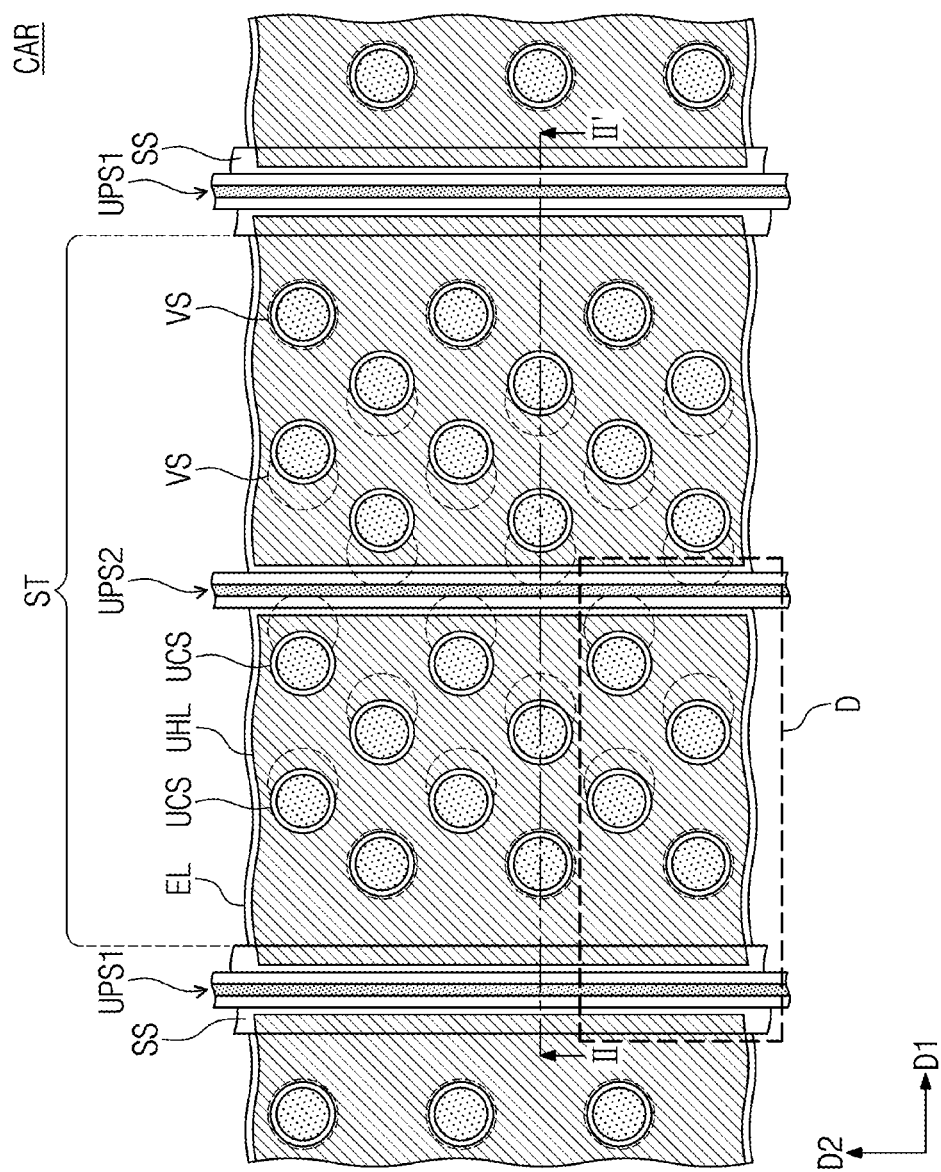
FIG. 13 is a plan view illustrating a portion of a cell array region of a semiconductor device according to an embodiment of the inventive concept.
Figure 14:
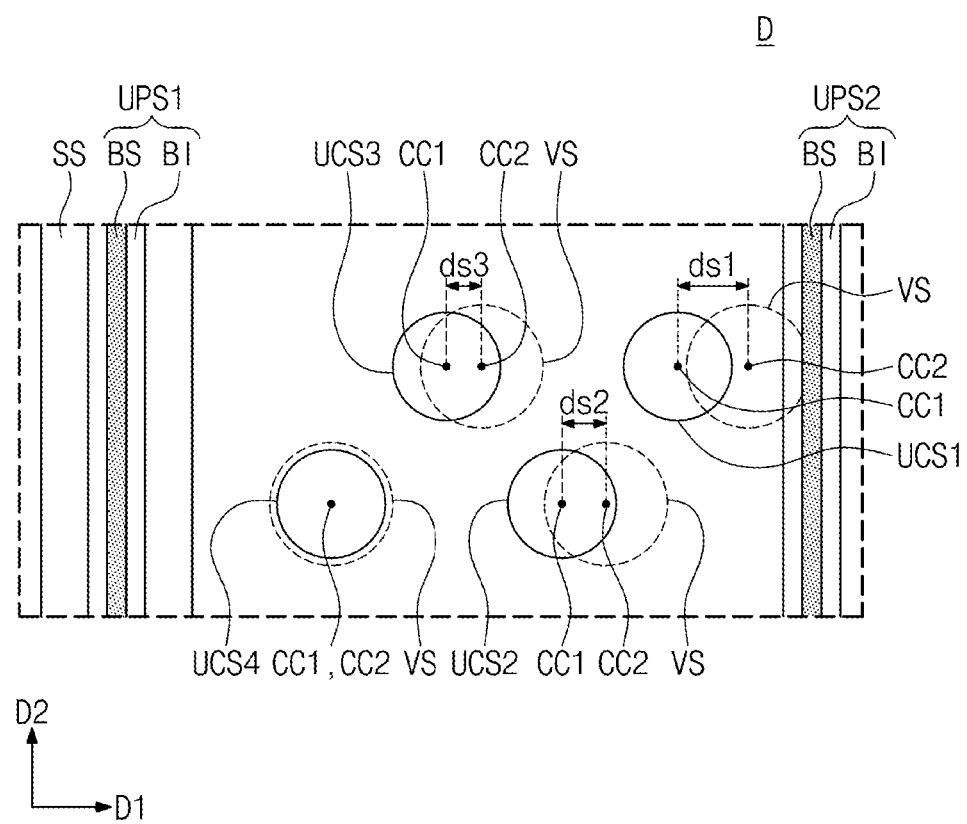
FIG. 14 is an enlarged plan view illustrating a portion (e.g., a portion 'D' of FIG. 13) of a cell array region according to an embodiment of the inventive concept.
Figure 15:
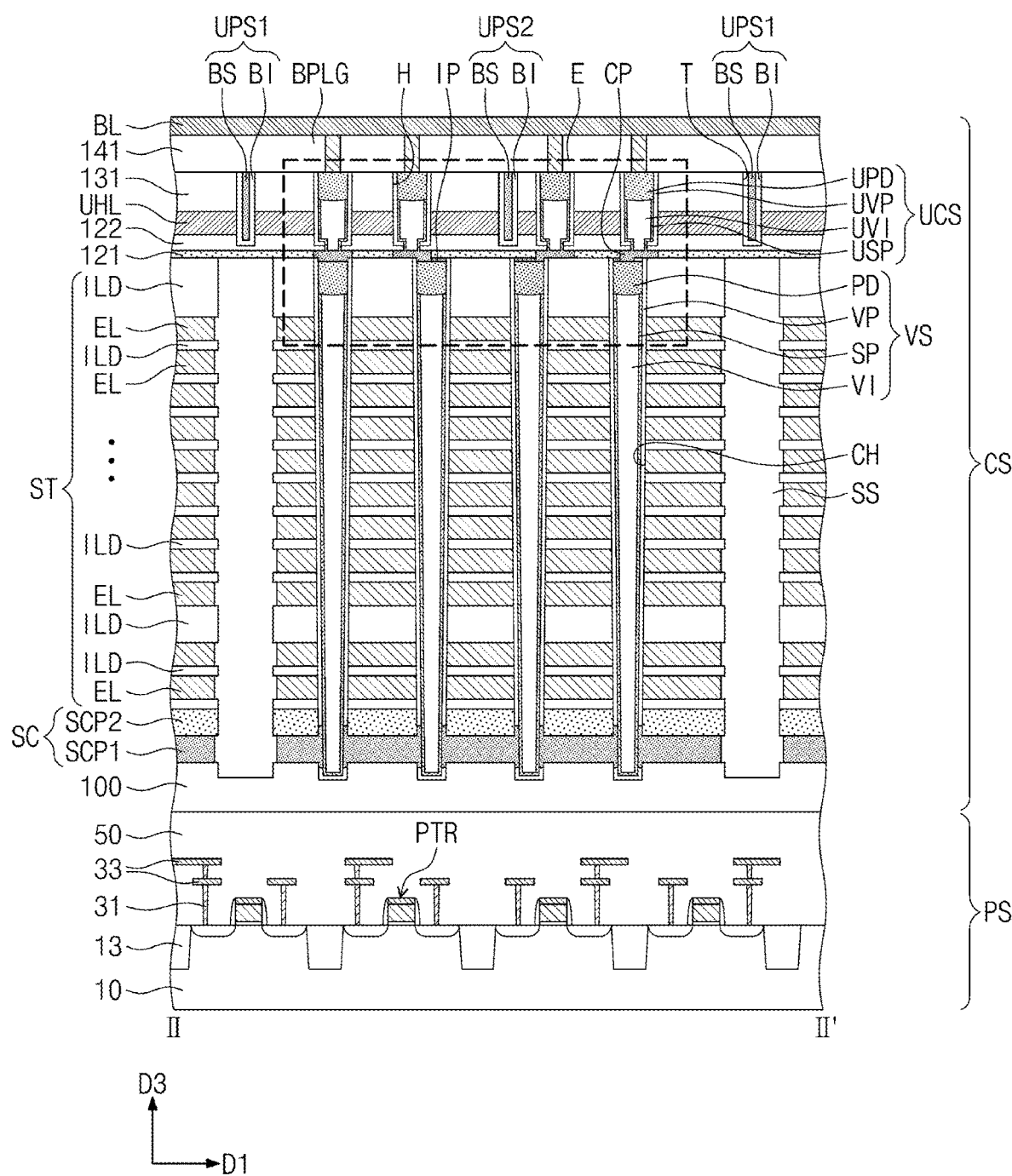
FIG. 15 is a sectional view, which is taken along a line II-II' of FIG. 13 to illustrate a semiconductor device according to an embodiment of the inventive concept.
Figure 16:
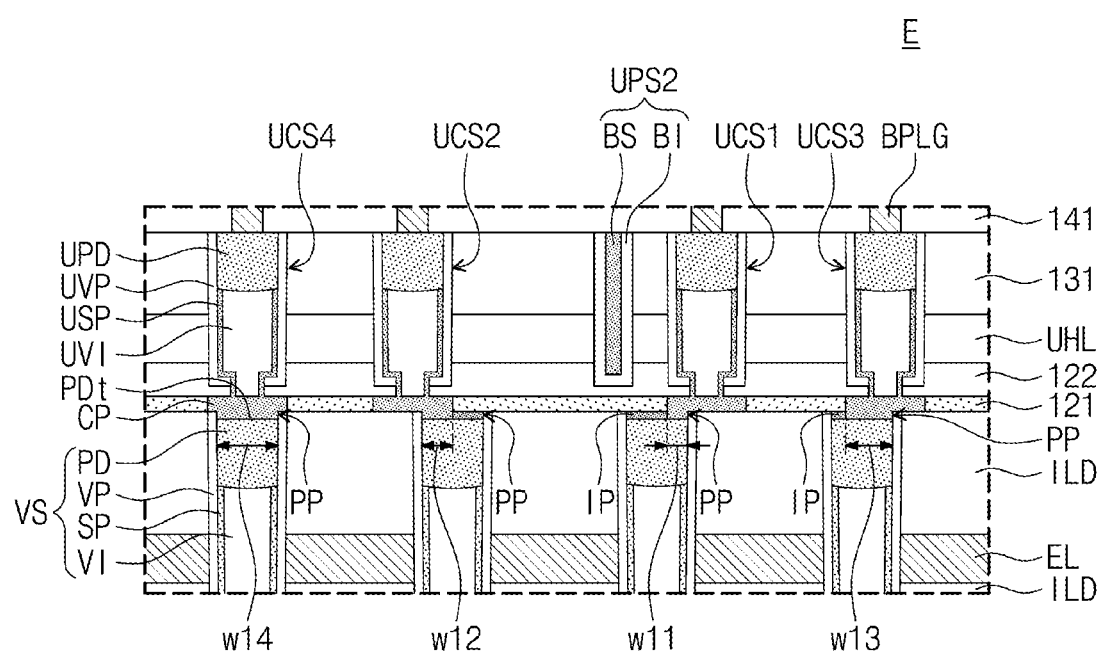
FIG. 16 is an enlarged sectional view illustrating a portion 'E' of FIG. 15.

FIG. 13 is a plan view illustrating a portion of a cell array region of a semiconductor device according to an embodiment of the inventive concept. FIG. 14 is an enlarged plan view illustrating a portion (e.g., a portion 'D' of FIG. 13) of a cell array region according to an embodiment of the inventive concept. FIG. 15 is a sectional view, which is taken along a line II-II' of FIG. 13 to illustrate a semiconductor device according to an embodiment of the inventive concept. FIG. 16 is an enlarged sectional view illustrating a portion 'E' of FIG. 15. For concise description, a previously described element may be identified by the same reference number without repeating an overlapping description thereof.

Referring to FIGS. 13 and 14, an overlapping area between the upper channel structures UCS and the vertical structures VS may be increased with increasing distance from the second upper separation pattern UPS2. That is, the overlapping area between the upper channel structures UCS and the vertical structures VS may be increased with decreasing distance to an outer edge of the electrode structure ST. The upper channel structures UCS, which are disposed adjacent to the outer edge of the electrode structure ST, may be fully overlapped with the vertical structures VS. Accordingly, the reliability in electric connection between the upper channel structures UCS and the vertical structures VS may be improved, and a size (e.g., a length in the first direction D1) of the electrode structure ST may be reduced.

In detail, the upper channel structures UCS may include first to fourth upper channel structures UCS1, UCS2, UCS3, and UCS4, which are sequentially arranged from the second upper separation pattern UPS2 in a direction toward the first upper separation pattern UPS1. The first to fourth upper channel structures UCS1, UCS2, UCS3, and UCS4 may be arranged in a zigzag shape. The first to fourth upper channel structures UCS1, UCS2, UCS3, and UCS4 may be at least partially overlapped with the vertical structures VS disposed therebelow. An overlapping area between the first upper channel structure UCS1 and the vertical structure VS may have the smallest value, and an overlapping area between the fourth upper channel structure UCS4 and the vertical structure VS may have the largest value.

The first to third upper channel structures UCS1, UCS2, and UCS3 may be not fully overlapped with the vertical structures VS. Centers CC1 (e.g., geometric centers in a planar view) of the first to third upper channel structures UCS1, UCS2, and UCS3 may be spaced apart from centers CC2 (e.g., geometric centers in a planar view) of the vertical structures VS. The center CC1 of the first upper channel structure UCS1 may be spaced apart from the center CC2 of a corresponding one of the vertical structures VS by a first distance ds1. The center CC1 of the second upper channel structure UCS2 may be spaced apart from the center CC2 of a corresponding one of the vertical structures VS by a second distance ds2. The center CC1 of the third upper channel structure UCS3 may be spaced apart from the center CC2 of a corresponding one of the vertical structures VS by a third distance ds3. The first distance ds1 may be larger than the second distance ds2, and the second distance ds2 may be larger than the third distance ds3. The fourth upper channel structure UCS4 may be concentric with a corresponding one of the vertical structures VS. For example, the fourth upper channel structure UCS4 may be fully overlapped with the vertical structure VS. In addition, the vertical structure VS may be fully overlapped with the fourth upper channel structure UCS4.

Referring to FIGS. 13, 15, and 16, widths of the protruding portions PP of the conductive patterns CP may vary depending on a distance to the second upper separation pattern UPS2. In detail, the protruding portions PP of the conductive patterns CP of the first to fourth upper channel structures UCS1, UCS2, UCS3, and UCS4 may have different widths from each other. A width w11 of the protruding portion PP of the conductive pattern CP of the first upper channel structure UCS1 may be smaller than a width w12 of the protruding portion PP of the conductive pattern CP of the second upper channel structure UCS2. The width w12 of the protruding portion PP of the conductive pattern CP of the second upper channel structure UCS2 may be smaller than a width w13 of the protruding portion PP of the conductive pattern CP of the third upper channel structure UCS3. The width w13 of the protruding portion PP of the conductive pattern CP of the third upper channel structure UCS3 may be smaller than a width w14 of the protruding portion PP of the conductive pattern CP of the fourth upper channel structure UCS4.

The protruding portions PP of the first to third upper channel structures UCS1, UCS2, and UCS3 may cover portions of top surfaces of the pads PD. The capping patterns IP may cover other or remaining portions of the top surfaces of the pads PD. Thus, widths of the capping patterns IP may vary depending on widths of the protruding portions PP. For example, the capping pattern IP on a side surface of the conductive pattern CP of the first upper channel structure UCS1 may have the smallest width. The capping pattern IP may not be formed below the fourth upper channel structure UCS4. In other words, the protruding portion PP of the conductive pattern CP of the fourth upper channel structure UCS4 may fully cover the top surface of the pad PD of the vertical structure VS.

Figure 17:
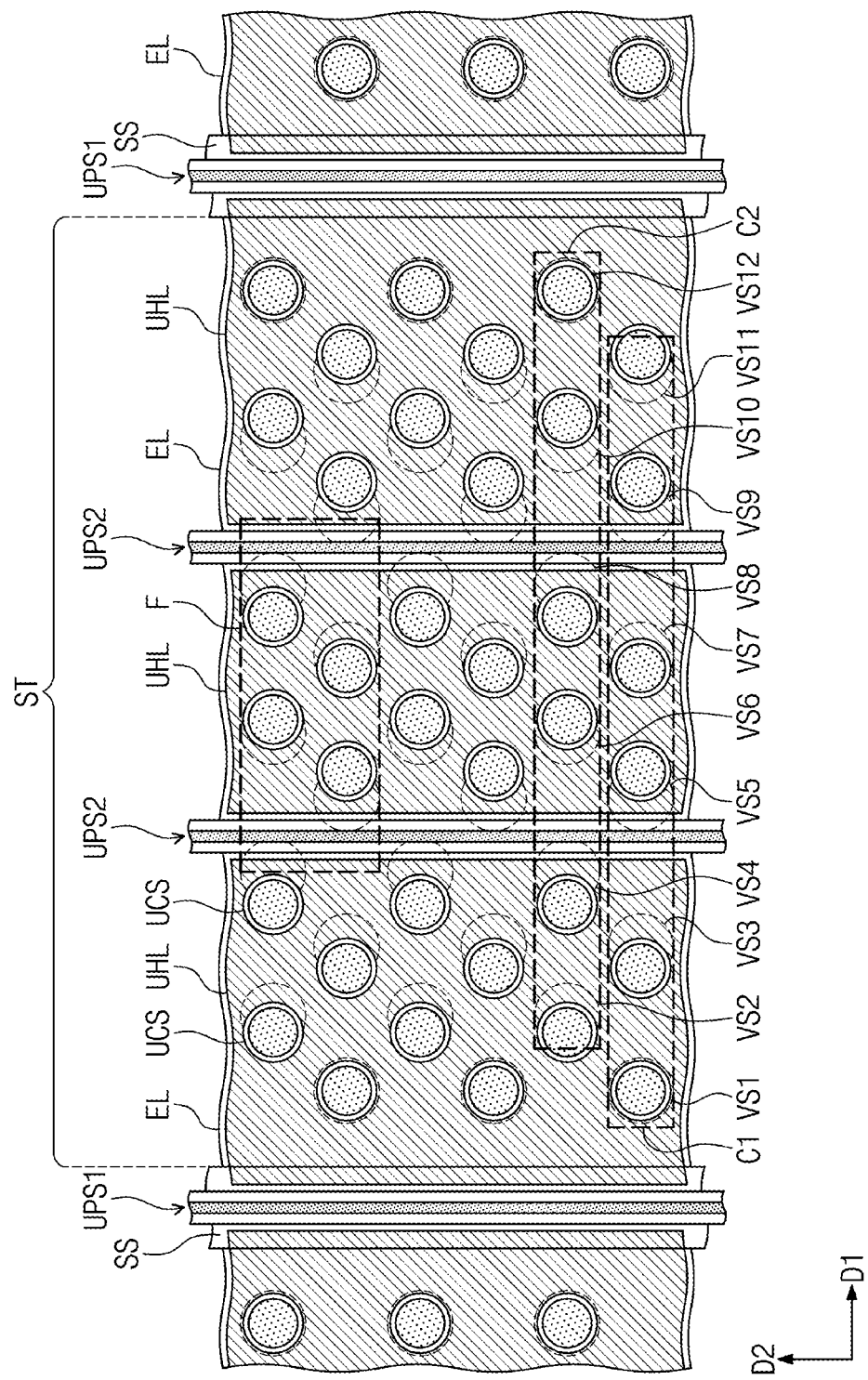
FIG. 17 is a plan view illustrating a portion of a cell array region of a semiconductor device according to an embodiment of the inventive concept.
Figure 18:
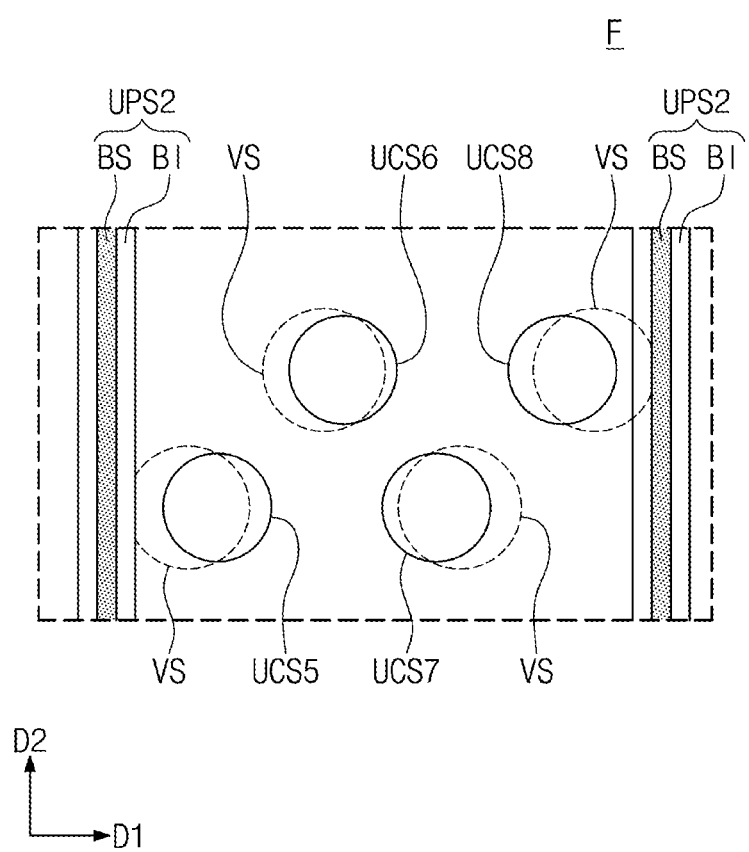
FIG. 18 is an enlarged plan view schematically illustrating a portion (e.g., a portion 'F' of FIG. 17) of a cell array region according to an embodiment of the inventive concept.

FIG. 17 is a plan view illustrating a portion of a cell array region of a semiconductor device according to an embodiment of the inventive concept. FIG. 18 is an enlarged plan view schematically illustrating a portion (e.g., a portion 'F' of FIG. 17) of a cell array region according to an embodiment of the inventive concept. For concise description, a previously described element may be identified by the same reference number without repeating an overlapping description thereof.

Referring to FIG. 17, the second upper separation patterns UPS2 may be provided between the separation structures SS. The second upper separation patterns UPS2 may divide the upper horizontal electrode UHL on each electrode structure ST into three electrodes that are electrically separated from each other. Each of the three electrically-separated electrodes may include a string selection line. For example, each of the electrodes may be at least one of the gate electrodes of the upper transistors UT1 and UT2 described with reference to FIG. 1.

The vertical structures VS may be provided to penetrate the electrode structure ST on the cell array region CAR. The vertical structures VS may be arranged in the first and second directions D1 and D2. Six vertical structures VS1, VS3, VS5, VS7, VS9, and VS11 may be arranged in the first direction D1 to form a first column C1, and six other vertical structures VS2, VS4, VS6, VS8, VS10, and VS12 may be arranged in the first direction D1 to form a second column C2. The first and second columns C1 and C2 may be alternately and repeatedly arranged in the second direction D2. The number of the vertical structures VS in the first column C1 may be equal to the number of the vertical structures VS in the second column C2. The vertical structures VS may be arranged in each of the first and second columns C1 and C2 to be spaced apart from each other by a constant or uniform distance in the first direction D1. The vertical structures VS1, VS3, VS5, VS7, VS9, and VS11 of the first column C1 may be arranged in a zigzag shape with respect to the vertical structures VS2, VS4, VS6, VS8, VS10, and VS12 of the second column C2.

First to fourth vertical structures VS1, VS2, VS3, and VS4 and ninth to twelfth vertical structures VS9, VS10, VS11, and VS12 may be disposed between the first upper separation pattern UPS1 and the second upper separation patterns UPS2. Fifth to eighth vertical structures VS5, VS6, VS7, and VS8 may be disposed between the second upper separation patterns UPS2. Each of the vertical structures VS1 to VS12 may be at least partially overlapped with the upper channel structures UCS. Overlapping areas between the first to fourth and ninth to twelfth vertical structures VS1, VS2, VS3, VS4, VS9, VS10, VS11, and VS12 and the upper channel structures UCS may be decreased with increasing distance to the separation structures SS. Overlapping areas between the fifth to eighth vertical structures VS5, VS6, VS7, and VS8 and the upper channel structures UCS may be increased with increasing distance to the second upper separation patterns UPS2.

Referring to FIGS. 17 and 18, the upper channel structures UCS may include fifth to eighth upper channel structures UCS5, UCS6, UCS7, and UCS8, which are disposed between the second upper separation patterns UPS2. Centers of the fifth and sixth upper channel structures UCS5 and UCS6 may be spaced apart from centers of the vertical structures VS placed therebelow in the first direction D1. Centers of the seventh and eighth upper channel structures UCS7 and UCS8 may be spaced apart from centers of the vertical structures VS placed therebelow in an opposite direction of the first direction D1.

FIGS. 19 to 23 and FIGS. 24A to 27A are sectional views, which are taken along the line I-I' of FIG. 6 to illustrate a method of fabricating a semiconductor device, according to an embodiment of the inventive concept. FIGS. 24B to 26B are enlarged sectional views illustrating portions 'A' of FIGS. 24A to 26A, respectively. FIGS. 27B to 27D are enlarged sectional views illustrating a portion 'A' of FIG. 27A.

Figure 19:
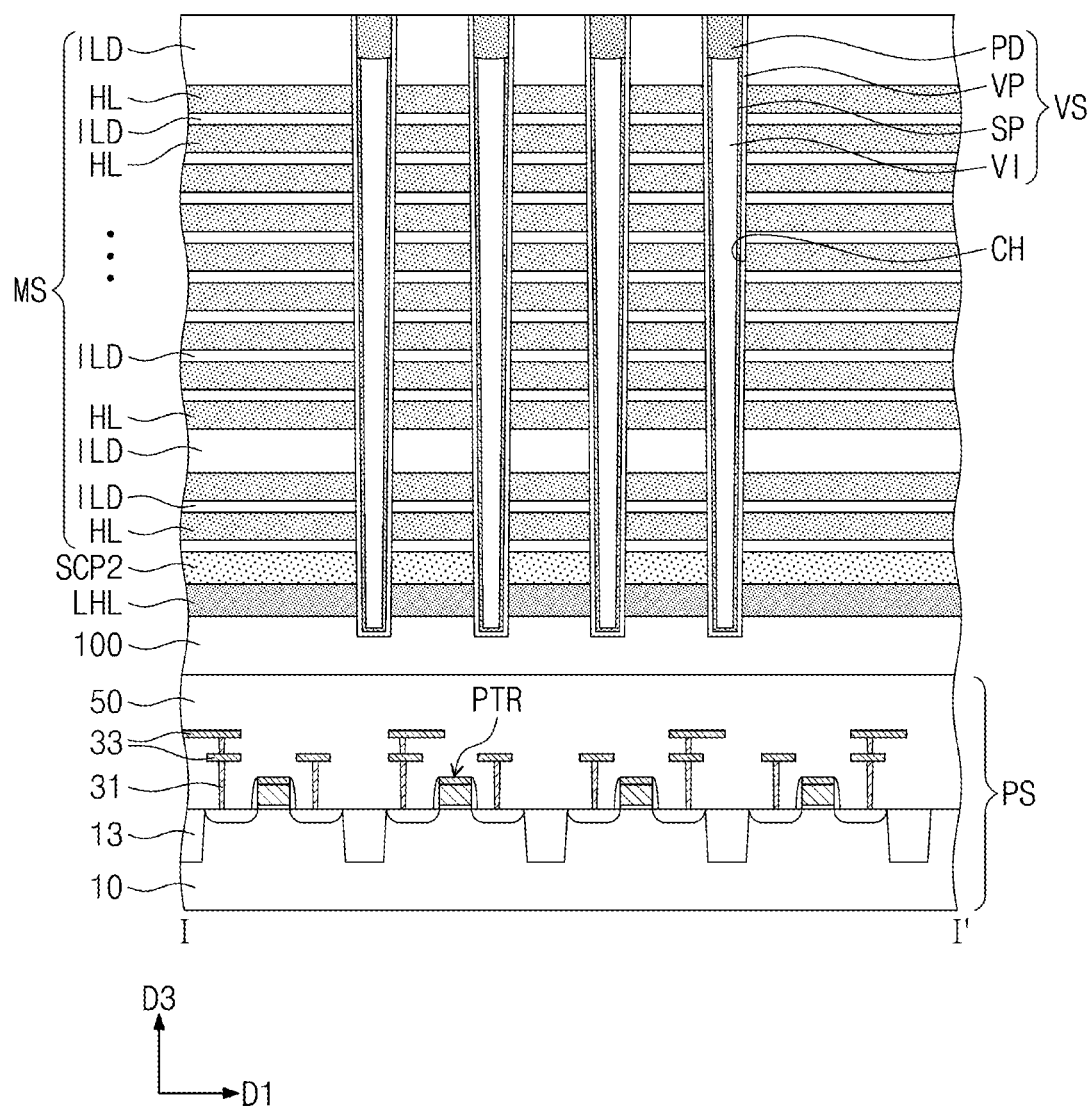
FIGS. 19, 20, 21, 22, and 23 and FIGS. 24A, 25A, 26A, and 27A are sectional views, which are taken along the line I-I' of FIG. 6 to illustrate a method of fabricating a semiconductor device, according to an embodiment of the inventive concept.

Referring to FIGS. 6 and 19, the peripheral circuit structure PS may be formed on the substrate 10. The formation of the peripheral circuit structure PS may include forming the peripheral transistors PTR on the substrate 10, forming the lower interconnection lines 33 and the peripheral contact 31 on the peripheral transistors PTR, and forming the lower insulating layer 50 on the substrate 10. The formation of the peripheral transistors PTR may include forming the device isolation layer 13 on the substrate 10 to define active regions, forming a gate insulating layer and a gate electrode on the active regions, and injecting impurities into the active regions to form source/drain regions. The formation of the lower insulating layer 50 may include forming an insulating layer to cover the peripheral transistors PTR, the lower interconnection lines 33, and the peripheral contact 31 and planarizing a top surface of the insulating layer.

The lower semiconductor layer 100, a lower sacrificial layer LHL, and the second horizontal pattern SCP2 may be sequentially formed on the lower insulating layer 50. The lower sacrificial layer LHL may include a silicon nitride layer or a silicon oxynitride layer. A mold structure MS may be formed on the second horizontal pattern SCP2. The mold structure MS may include the insulating patterns ILD and sacrificial layers HL, which are alternately stacked. The sacrificial layers HL may be formed of or include at least one of materials having an etch selectivity with respect to the insulating patterns ILD. For example, the sacrificial layers HL may include a silicon nitride layer or a silicon oxynitride layer.

Next, the vertical structures VS may be formed to penetrate the mold structure MS. The formation of the vertical structures VS may include forming the channel holes CH to penetrate the mold structure MS and sequentially forming the vertical insulating pattern VP, the vertical semiconductor pattern SP, and the gapfill insulating pattern VI in the channel holes CH. The conductive pad PD may be formed on the top surfaces of the gapfill insulating pattern VI and the vertical semiconductor pattern SP.

Figure 20:
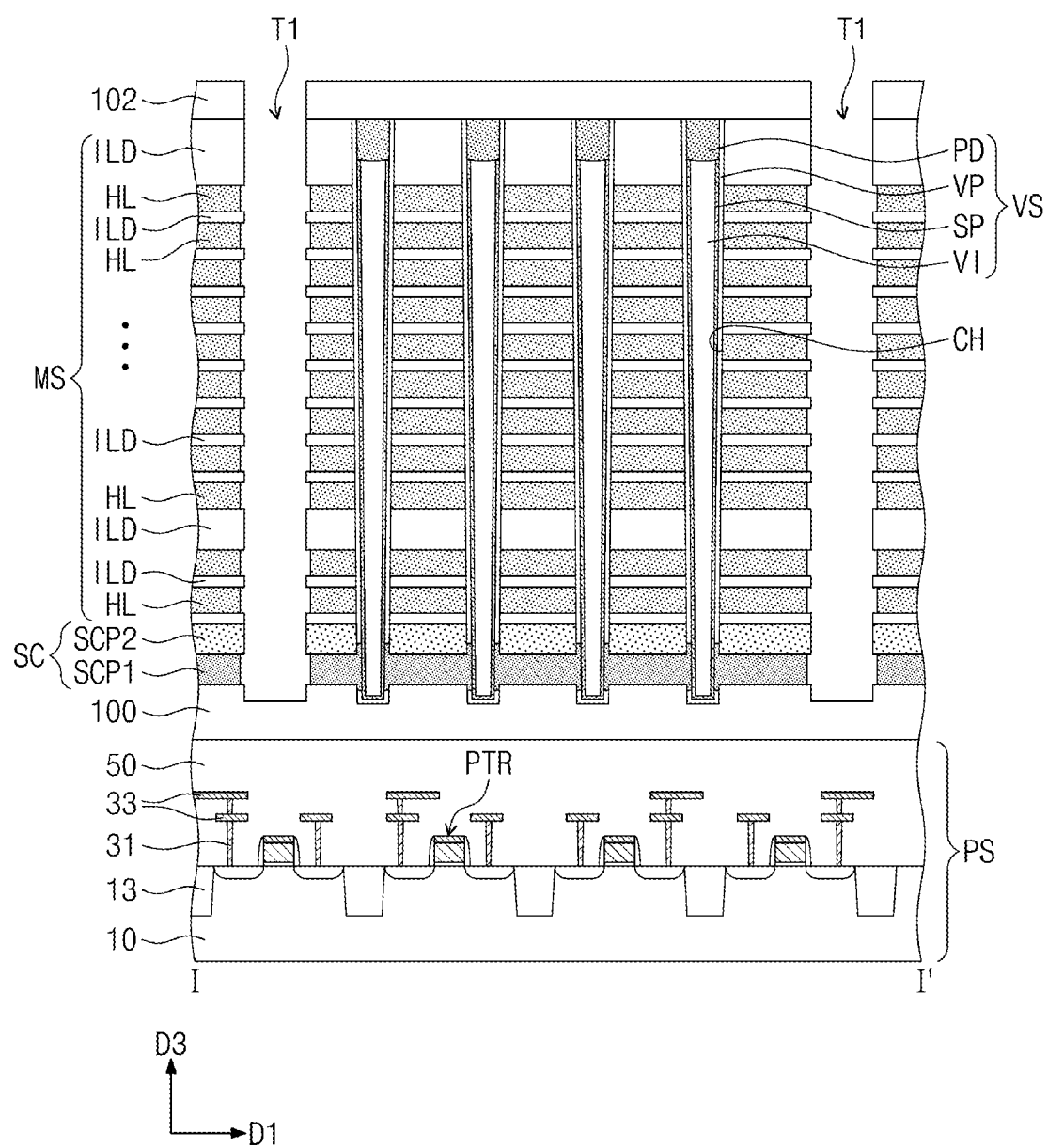

Referring to FIGS. 6 and 20, first trenches T1 may be formed to cross the mold structure MS in the second direction D2. The formation of the first trench T1 may include forming a mask layer 102 on a top surface of the mold structure MS to expose a portion of the mold structure MS and etching the mold structure MS using the mask layer 102 as an etch mask. In an embodiment, the first trenches T1 may be formed when the channel holes CH are formed.

Figure 21:
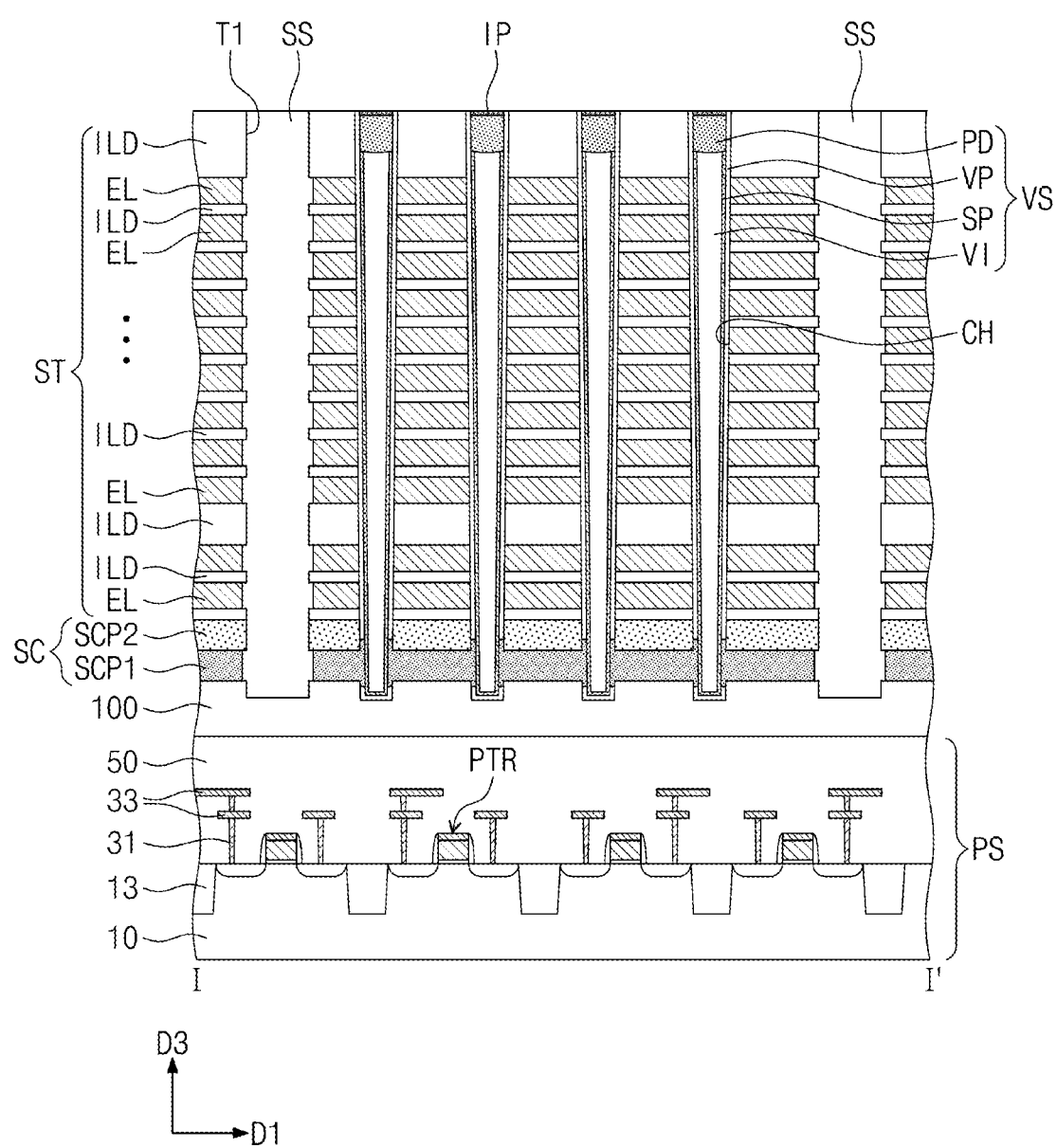

Referring to FIGS. 6 and 21, the electrode structure ST may be formed by replacing the sacrificial layers HL, which are exposed through the first trenches T1, with the electrodes EL respectively. In detail, the sacrificial layers HL, which are exposed through the first trenches T1, may be selectively removed. Thereafter, the electrodes EL may be respectively formed in spaces that are formed by the removing of the sacrificial layers HL. The separation structure SS may be formed in the first trench T1. The formation of the separation structure SS may include filling the entire portion of the first trench T1 with an insulating material and performing a planarization process on the electrode structure ST. In an embodiment, the mask layer 102 may be removed during the planarization process. Thus, a top surface of the separation structure SS may be located at the same level as a top surface of the vertical structure VS. Thereafter, the capping pattern IP may be formed by performing an oxidation process on the top surface of the conductive pad PD of the vertical structure VS, which is exposed by the planarization process.

Figure 22:
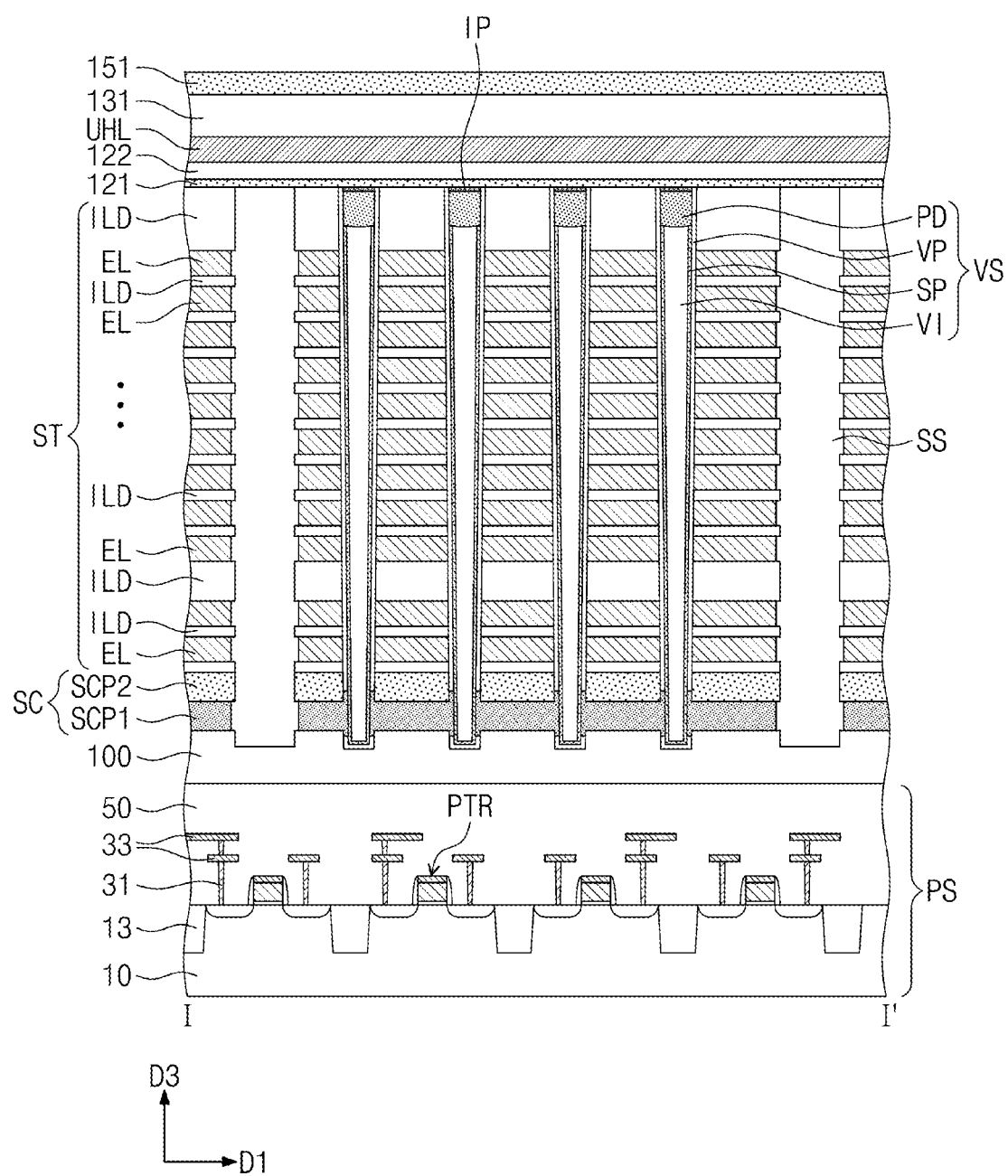

Referring to FIGS. 6 and 22, the first insulating layer 121, the second insulating layer 122, the upper horizontal electrode UHL, the first interlayer insulating layer 131, and an upper sacrificial layer 151 may be sequentially formed on the electrode structure ST. The formation of the first and second insulating layers 121 and 122 may include forming the first insulating layer 121 on the electrode structure ST and forming the second insulating layer 122, which is formed of a material having an etch selectivity with respect to the first insulating layer 121, on the first insulating layer 121. The first insulating layer 121 may be formed to cover the capping pattern IP and the separation structure SS. The upper horizontal electrode UHL may be formed a thickness larger than the first and second insulating layers 121 and 122.

Figure 23:
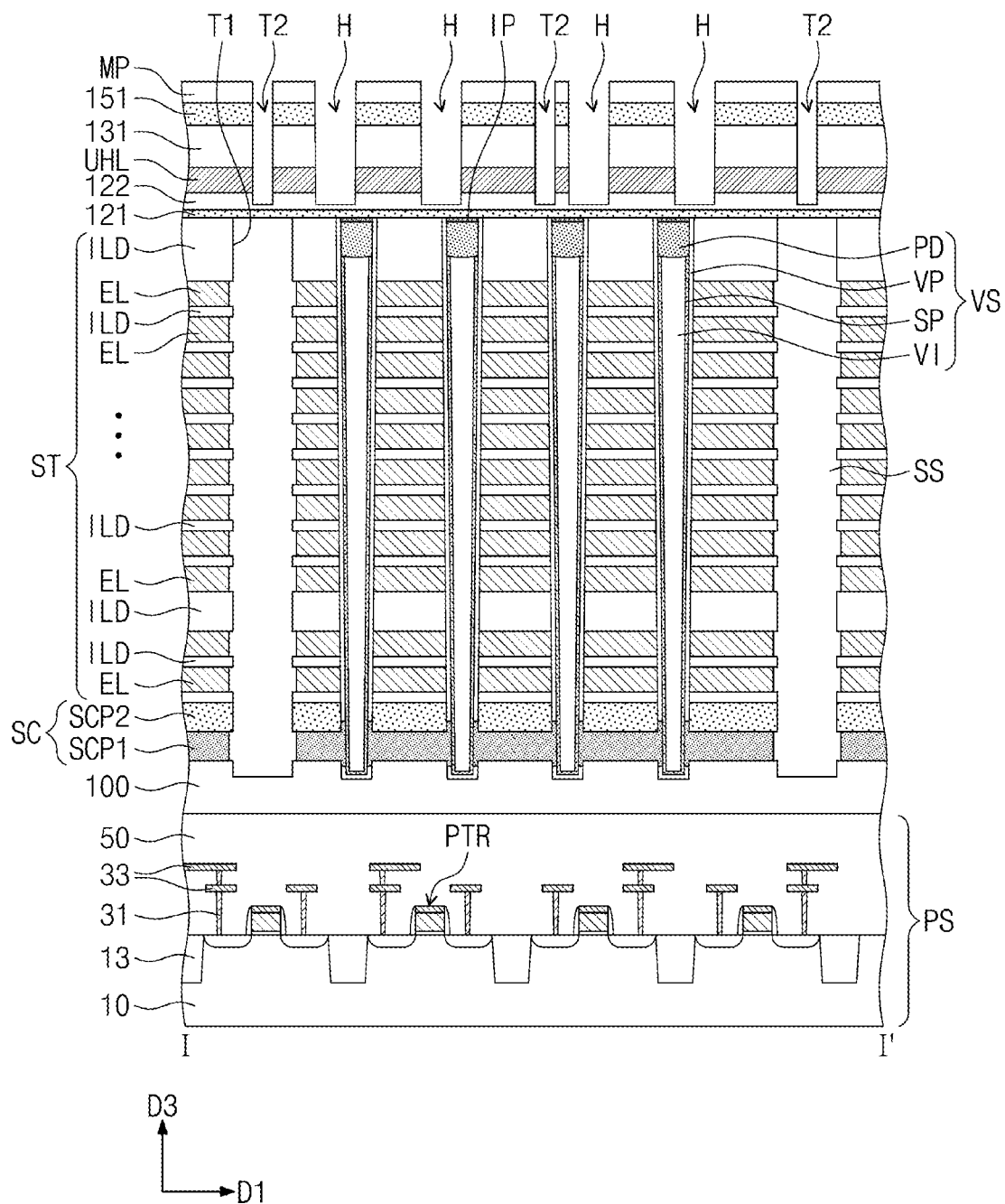

Referring to FIGS. 6 and 23, the upper holes H and second trenches T2 may be formed. The formation of the upper holes H and the second trenches T2 may include forming a mask pattern MP on the upper sacrificial layer 151 and performing an etching process using the mask pattern MP as an etch mask. Bottom surfaces of the upper holes H and the second trenches T2 may be located at a level between the bottom surface of the upper horizontal electrode UHL and the top surface of the first insulating layer 121.

Figure 24A:
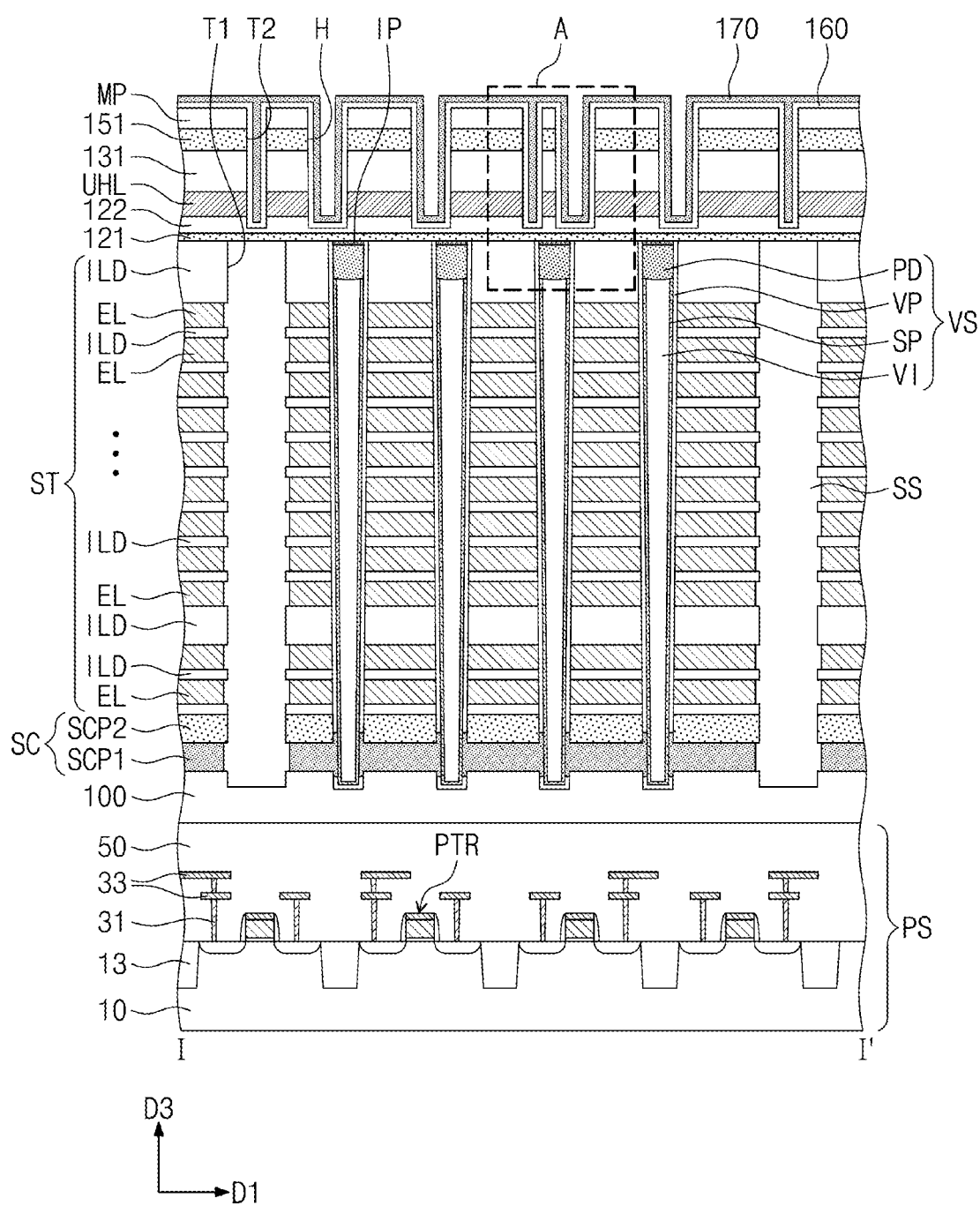
Figure 24B:
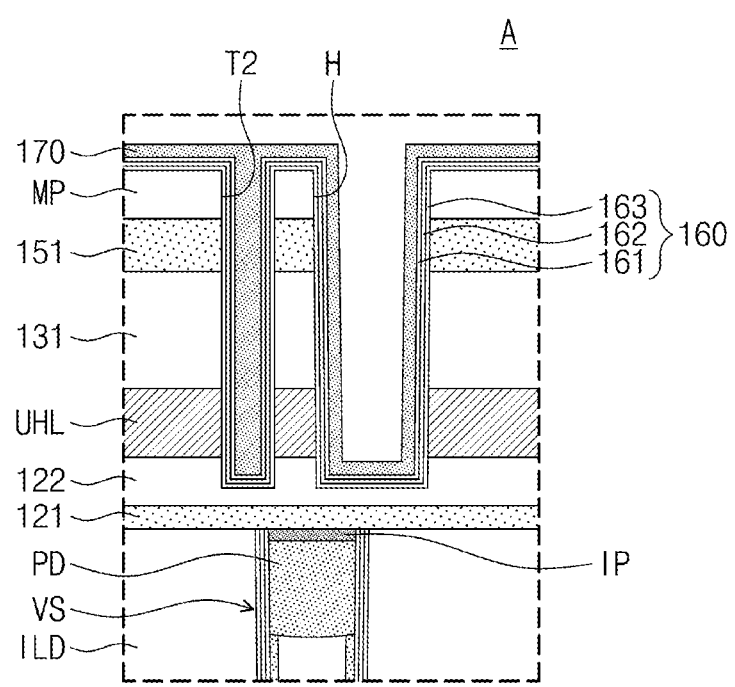
FIGS. 24B, 25B, and 26B are enlarged sectional views illustrating portions 'A' of FIGS. 24A, 25A, and 26A, respectively.

Referring to FIGS. 6, 24A, and 24B, a preliminary upper insulating layer 160 and an upper sacrificial layer 170 may be formed in the upper holes H and the second trenches T2. The preliminary upper insulating layer 160 and the upper sacrificial layer 170 may be formed to partially fill the upper holes H and to fully fill the second trenches T2. The upper sacrificial layer 170 may include a first layer 161, a second layer 162, and a third layer 163, which are sequentially stacked. The preliminary upper insulating layer 160 may be formed to conformally cover inner surfaces of the upper holes H, inner surfaces of the second trenches T2, and a top surface of the mask pattern MP. The upper sacrificial layer 170 may be formed to partially fill remaining portions of the upper holes H and to fully fill remaining portions of the second trenches T2.

Figure 25A:
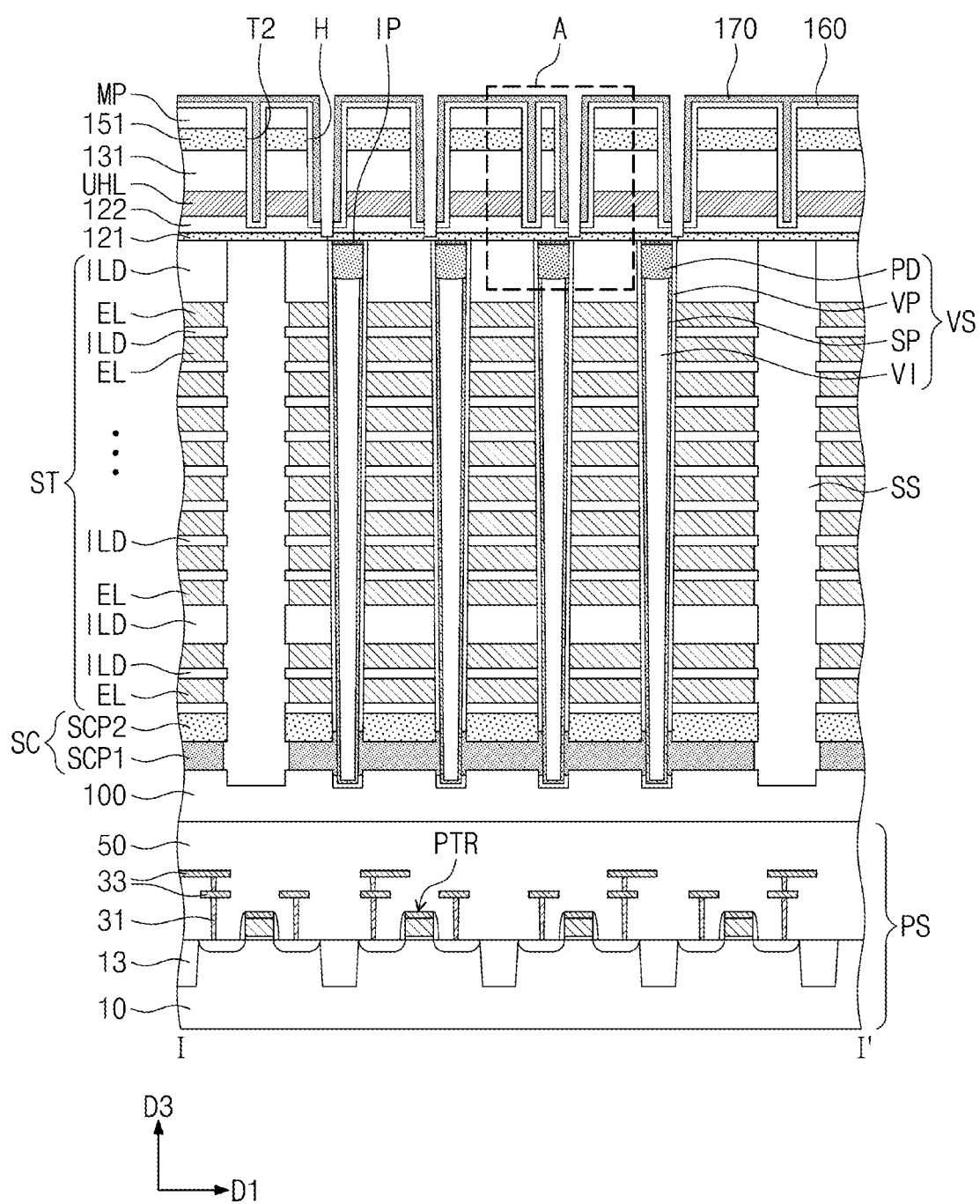
Figure 25B:
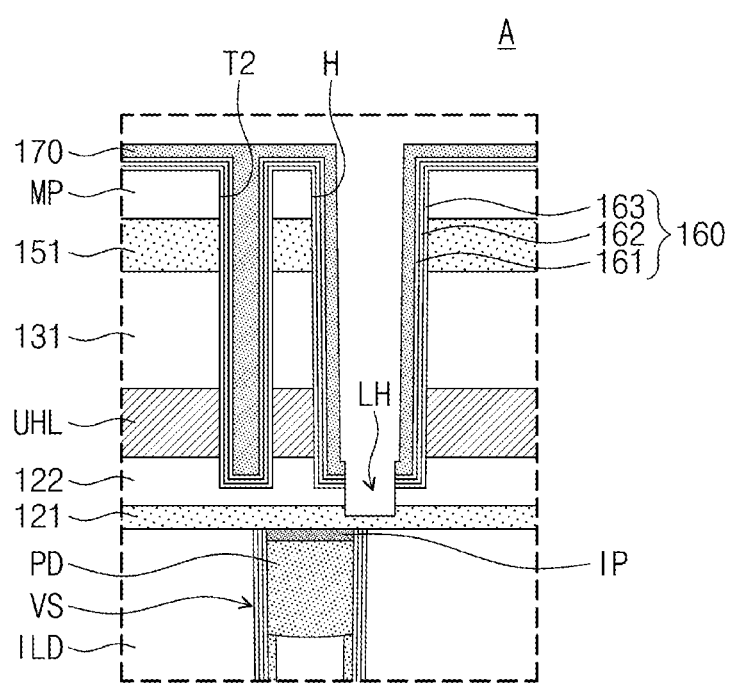

Referring to FIGS. 6, 25A, and 25B, the lower holes LH may be formed to extend to a region below the bottom surfaces of the upper holes H. In an embodiment, the lower holes LH may be formed through an etch-back process. The preliminary upper insulating layer 160 and the upper sacrificial layer 170 on the bottom surfaces of the upper holes H may be partially removed during the etch-back process. In addition, a portion of the first insulating layer 121 may be removed, and a side surface of the second insulating layer 122 may be exposed through the lower holes LH. The bottom surface of the lower hole LH may be located at a level between the top and bottom surfaces of the first insulating layer 121.

Figure 26A:
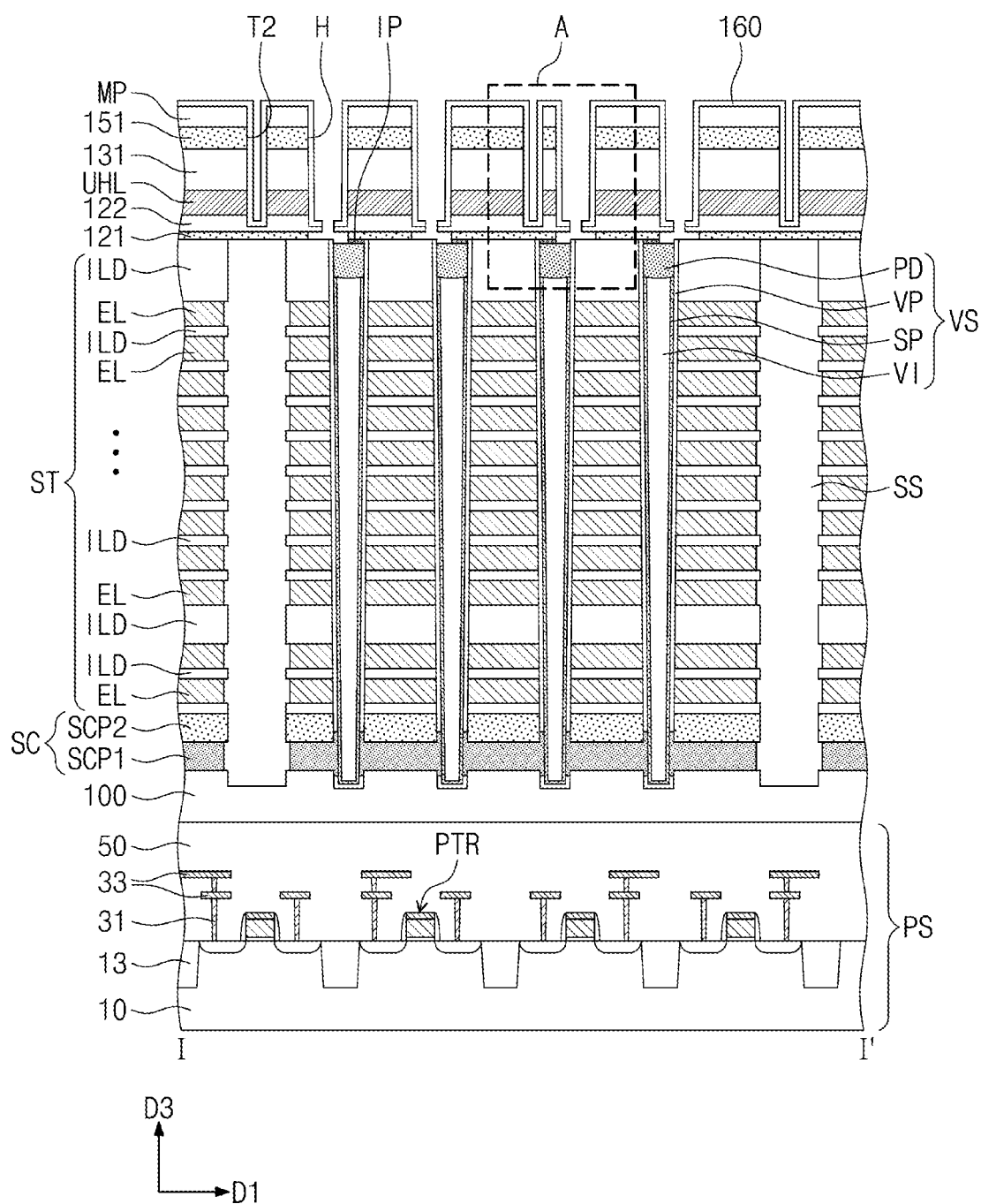
Figure 26B:
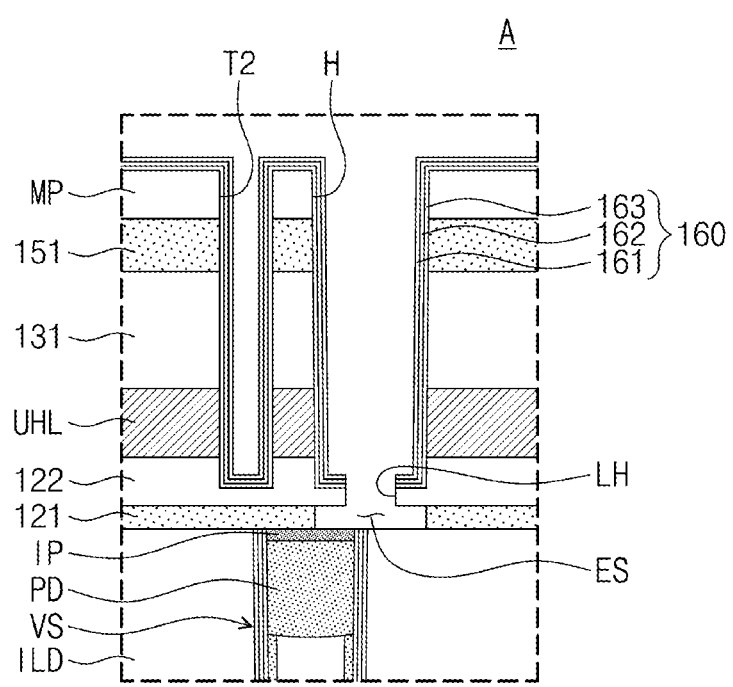

Referring to FIGS. 6, 26A, and 26B, an expanded region ES may be formed in the first insulating layer 121. The formation of the expanded region ES may include performing an etching process on the first insulating layer 121 exposed through the lower hole LH. In an embodiment, the etching process may be performed using an etchant capable of selectively etching the first insulating layer 121. Thus, the expanded region ES may be formed to have a width larger than the lower hole LH. The expanded region ES may be formed to expose a top surface of the insulating pattern ILD and a top surface of the capping pattern IP. The upper sacrificial layer 170 may be removed after the formation of the expanded region ES.

Referring to FIGS. 6 and 27A to 27D, the conductive pattern CP, the upper channel structure UCS and the upper separation patterns UPS may be formed. The conductive pattern CP may be formed to be connected to the vertical structure VS. The upper channel structure UCS may be formed to penetrate the upper horizontal electrode UHL and be connected to the conductive pattern CP. The upper separation patterns UPS may be formed to cross the upper horizontal electrode UHL in the second direction D2.

Figure 27A:
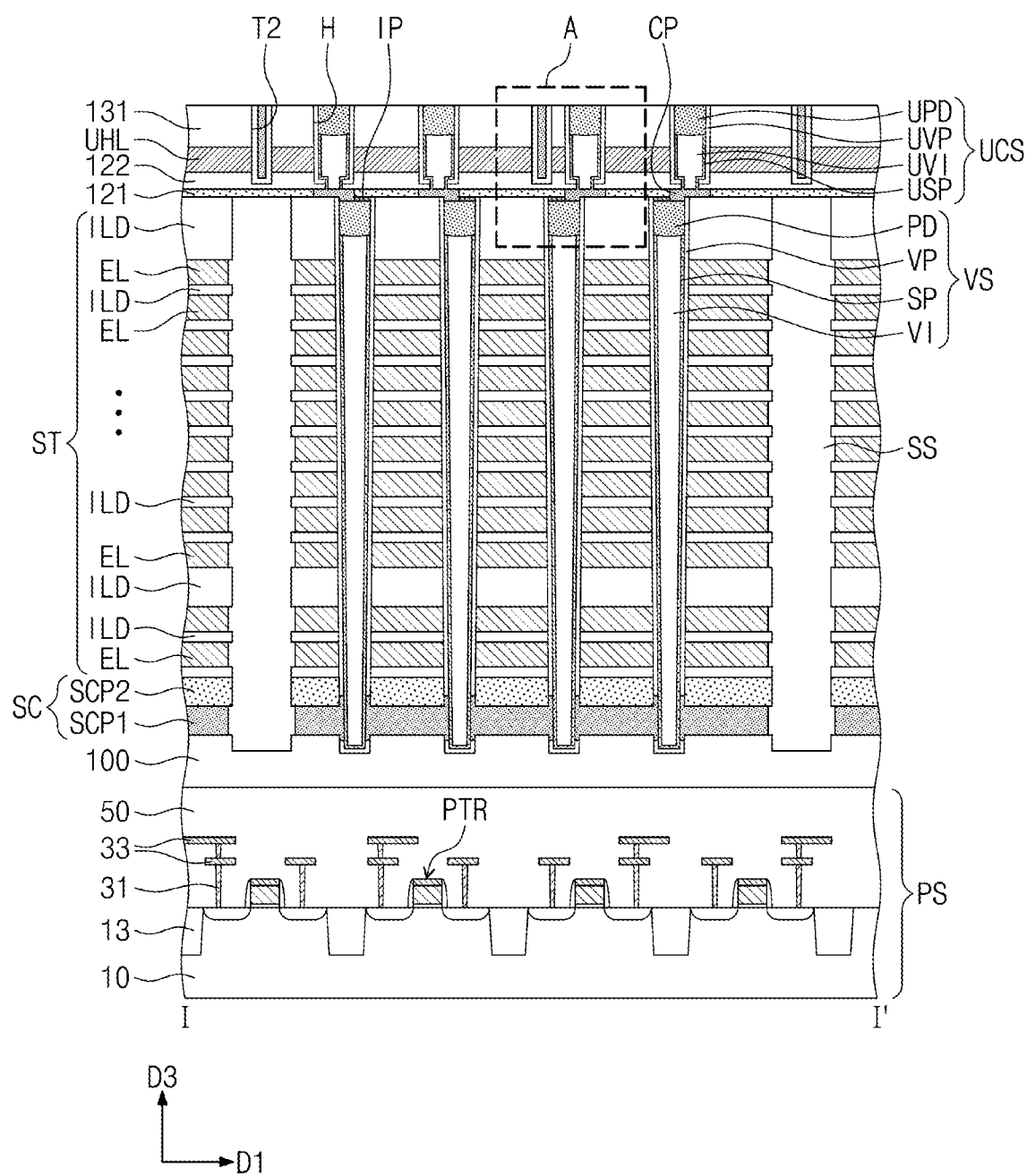
Figure 27B:
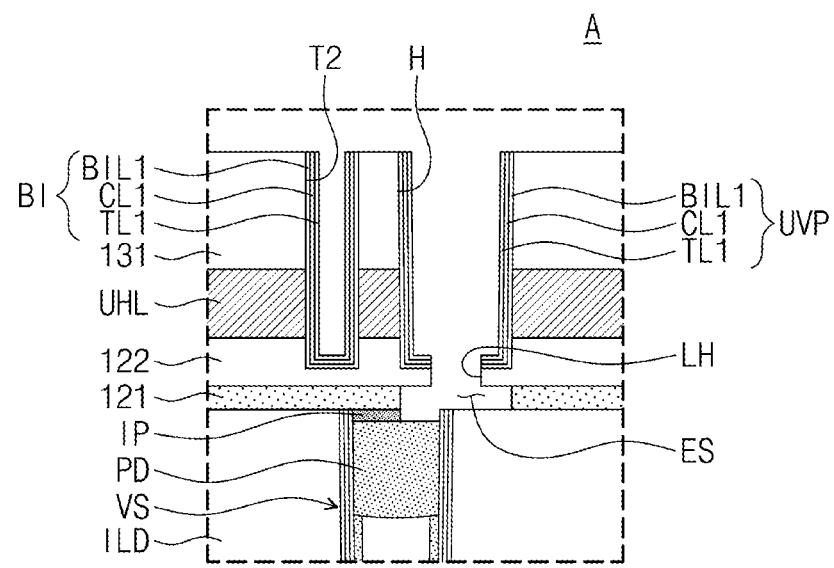
FIGS. 27B, 27C, and 27D are enlarged sectional views illustrating a portion 'A' of FIG. 27A.

In detail, referring to FIGS. 26B and 27B, the preliminary upper insulating layer 160 may be partially removed to form the barrier layer BI and the upper insulating pattern UVP, which are formed from the preliminary upper insulating layer 160. The partial removal of the preliminary upper insulating layer 160 may be performed using a planarization process. The barrier layer BI and the upper insulating pattern UVP may be portions of the preliminary upper insulating layer 160 which are left in the second trench T2 and the upper hole H, respectively, after the planarization process. The planarization process may be performed using the upper sacrificial layer 151 as an etch stop layer until a top surface of the first interlayer insulating layer 131 is exposed. The upper sacrificial layer 151 and the mask pattern MP may be removed during the planarization process. An etching process on the capping pattern IP may be performed to expose a portion of the top surface of the conductive pad PD.

Figure 27C:
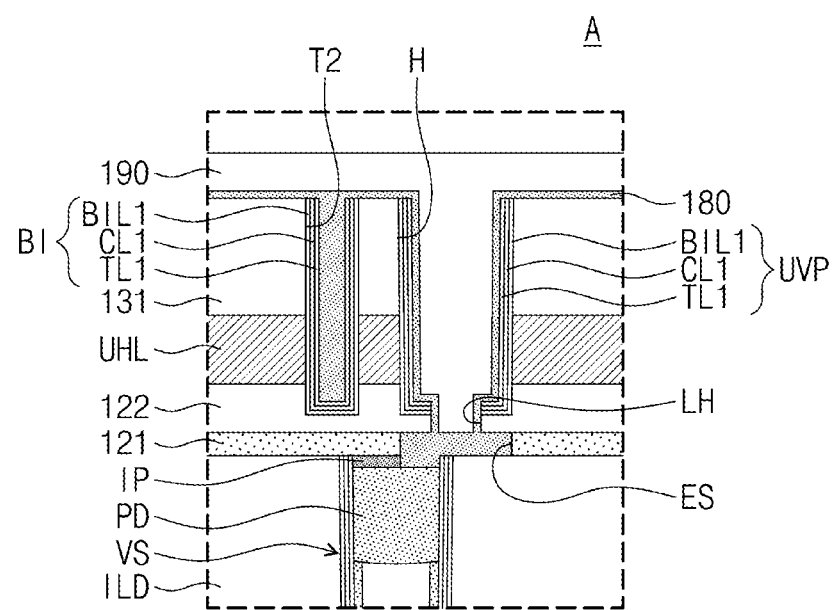

Referring to FIG. 27C, a semiconductor layer 180 and an insulating gapfill layer 190 may be sequentially formed. The semiconductor layer 180 may be formed to fully fill a remaining portion of the second trench T2. The semiconductor layer 180 may cover an inner side surface of the upper insulating pattern UVP in the upper hole H and may fill an inner space of the expanded region ES. The insulating gapfill layer 190 may be formed on the semiconductor layer 180 to fully fill a remaining portion of the upper hole H.

Figure 27D:
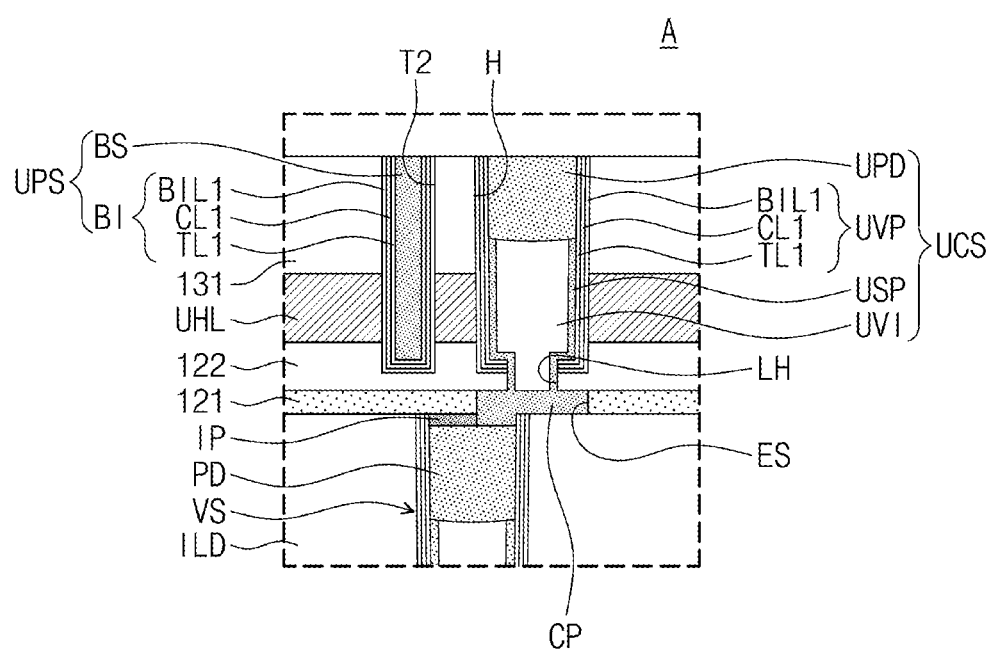

Referring to FIGS. 27C and 27D, the gapfill semiconductor pattern BS, the upper semiconductor pattern USP and the conductive pattern CP may be formed from the semiconductor layer 180 by partially removing the semiconductor layer 180. The partial removal of the semiconductor layer 180 may be performed using a planarization process. The gapfill semiconductor pattern BS and the upper semiconductor pattern USP may be portions of the semiconductor layer 180 which are left in the second trench T2, the upper hole H and the lower hole LH, respectively, after the planarization process. The conductive pattern CP may be formed by another portion of the semiconductor layer 180 filling the extension region ES. The top surface of the first interlayer insulating layer 131 may be exposed by the planarization process.

Next, the upper gapfill insulating pattern UVI may be formed by partially removing the insulating gapfill layer 190 left in the upper hole H. The upper semiconductor pattern USP may also be removed during the partial removal of the insulating gapfill layer 190. The upper conductive pad UPD may be formed on the upper semiconductor pattern USP and the upper gapfill insulating pattern UVI.

Referring back to FIGS. 3 and 7, the second interlayer insulating layer 141 may be formed on the first interlayer insulating layer 131 to cover the upper separation patterns UPS and the upper channel structures UCS. The contact plugs BPLG may be formed to penetrate the second interlayer insulating layer 141 and may be coupled to the upper conductive pads UPD, respectively. The bit lines BL, which are electrically connected to the contact plugs BPLG, may be formed on the second interlayer insulating layer 141.

Figure 28:
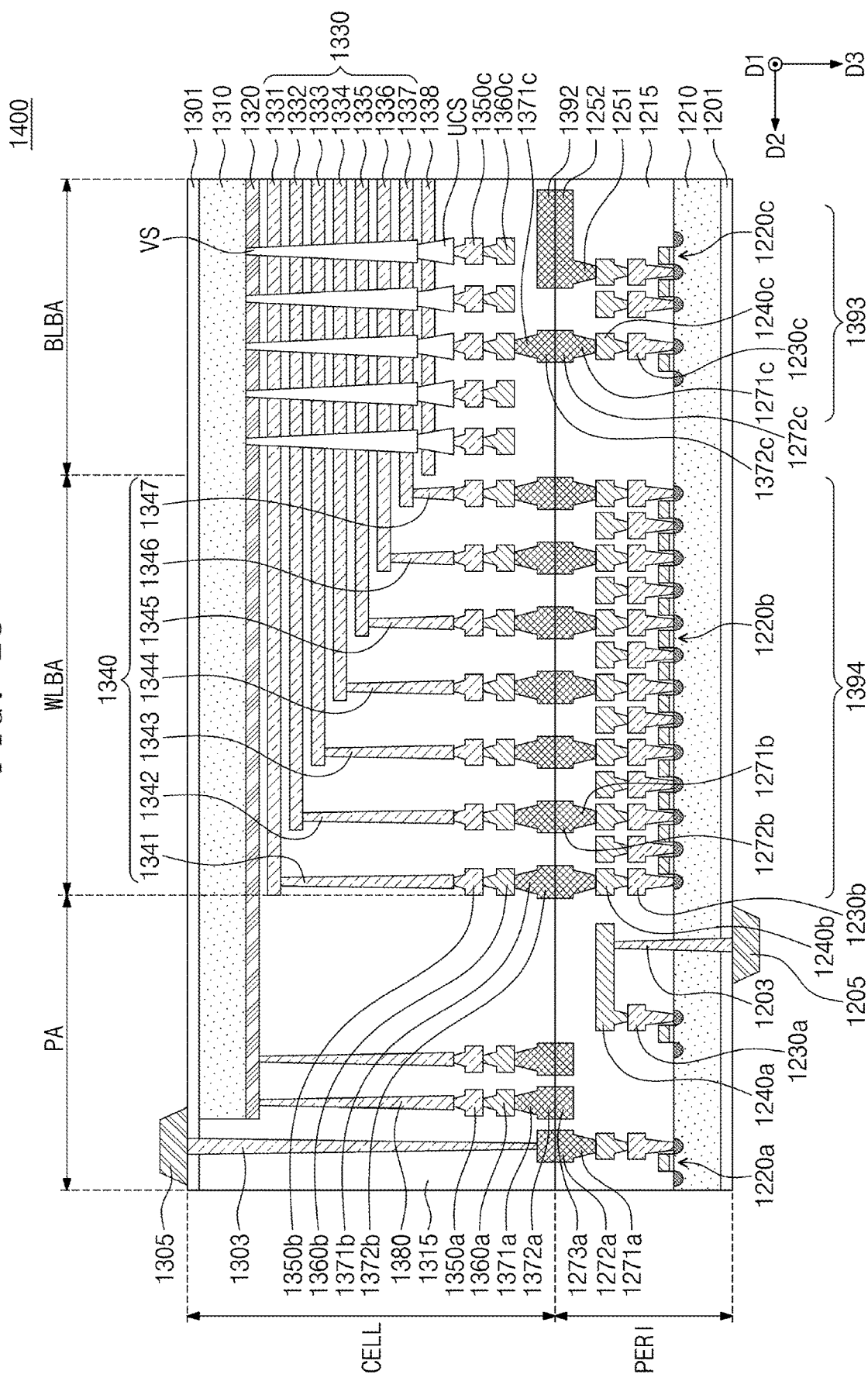
FIG. 28 is a sectional view illustrating a semiconductor device according to an embodiment of the inventive concept.

FIG. 28 is a sectional view illustrating a semiconductor device according to an embodiment of the inventive concept. For concise description, a previously described element may be identified by the same reference number without repeating an overlapping description thereof.

Referring to FIG. 28, a memory device 1400 may have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other using a bonding method. In an embodiment, the bonding method may mean a method of electrically connecting a bonding metal, which is provided as the uppermost metal layer of the upper chip, to a bonding metal, which is provided as the uppermost metal layer of the lower chip. For example, in the case where the bonding metals are formed of copper (Cu), the bonding method may be a Cu-to-Cu bonding method, but in an embodiment, the bonding metals may be formed of aluminum (Al) or tungsten (W).

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220*a*, 1220*b*, and 1220*c* formed on the first substrate 1210, first metal layers 1230*a*, 1230*b*, and 1230*c* connected to the circuit devices 1220*a*, 1220*b*, and 1220*c*, respectively, and second metal layers 1240*a*, 1240*b*, and 1240*c* formed on the first metal layers 1230*a*, 1230*b*, and 1230*c*. In an embodiment, the first metal layers 1230*a*, 1230*b*, and 1230*c* may be formed of a material (e.g., tungsten) having a relatively high electric resistivity, and the second metal layers 1240*a*, 1240*b*, and 1240*c* may be formed of a material (e.g., copper) having a relatively low electric resistivity.

Although only the first metal layers 1230*a*, 1230*b*, and 1230*c* and the second metal layers 1240*a*, 1240*b*, and 1240*c* are illustrated and described in the present specification, the inventive concept is not limited thereto and at least one metal layer may be additionally formed on the second metal layers 1240*a*, 1240*b*, and 1240*c*. At least one of the additional metal layers, which are formed on the second metal layers 1240*a*, 1240*b*, and 1240*c*, may be formed of or include a low resistive material (e.g., aluminum) whose electric resistivity is lower than the material (e.g., copper) of the second metal layers 1240*a*, 1240*b*, and 1240*c*.

The interlayer insulating layer 1215 may be disposed on the first substrate 1210 to cover the circuit devices 1220*a*, 1220*b*, and 1220*c*, the first metal layers 1230*a*, 1230*b*, and 1230*c*, and the second metal layers 1240*a*, 1240*b*, and 1240*c* and may be formed of or include at least one of insulating materials (e.g., silicon oxide or silicon nitride).

Lower bonding metals 1271*b* and 1272*b* may be formed on the second metal layer 1240*b* of the word line bonding region WLBA. The word line bonding region WLBA may correspond to the connection region CNR described with reference to FIG. 5. In the word line bonding region WLBA, the lower bonding metals 1271*b* and 1272*b* of the peripheral circuit structure PERI may be electrically connected to upper bonding metals 1371*b* and 1372*b* of the cell array structure CELL using a bonding method, and the lower bonding metals 1271*b* and 1272*b* and the upper bonding metals 1371*b* and 1372*b* may be formed of or include at least one of aluminum, copper, or tungsten.

At least one memory block may be provided in the cell array structure CELL. The cell array structure CELL may include a second substrate 1310 and a common source line 1320. A plurality of electrodes 1331 to 1337 (1330) may be stacked on the second substrate 1310 in a direction perpendicular to a top surface of the second substrate 1310. The electrodes 1331 to 1337 (1330) may correspond to the electrodes EL described with reference to FIGS. 3 to 8. An upper electrode 1338 may be stacked on the electrodes 1331 to 1337 (1330). The upper electrode 1338 may correspond to the upper horizontal electrode UHL described with reference to FIGS. 3 to 8.

In the bit line bonding region BLBA, the vertical structure VS may extend in a direction, which is perpendicular to the top surface of the second substrate 1310, to penetrate the electrodes 1330. The vertical structure VS may include a data storage layer, a channel layer, a gapfill insulating layer, a pad, and so forth. In the bit line bonding region BLBA, the upper channel structure UCS may be provided to penetrate the upper electrode 1338 and may be coupled to the vertical structure VS. The upper channel structure UCS may include an upper data storage layer, an upper channel layer, an upper gapfill insulating layer, and so forth, and the upper channel layer may be electrically connected to a first metal layer 1350*c* and a second metal layer 1360*c*. In an embodiment, the first metal layer 1350*c* may serve as a bit line contact, and the second metal layer 1360*c* may serve as a bit line. The upper channel layer may correspond to the upper semiconductor pattern USP described with reference to FIGS. 3 to 8.

A region, in which the vertical structure VS, the upper channel structure UCS, and the bit line 1360*c* are provided, may be defined as the bit line bonding region BLBA, and may correspond to the cell array region CAR described with reference to FIG. 5. In the peripheral circuit structure PERI adjacent to the bit line bonding region BLBA, the bit line 1360*c* may be electrically connected to the circuit devices 1220*c* constituting a page buffer 1393. As an example, the bit line 1360*c* may be connected to the peripheral circuit structure PERI through upper bonding metals 1371*c* and 1372*c*, and the upper bonding metals 1371*c* and 1372*c* may be connected to lower bonding metals 1271*c* and 1272*c*, which are connected to the circuit devices 1220*c* of the page buffer 1393.

In the word line bonding region WLBA, the electrodes 1330 may extend in the second direction D2, which is parallel to the top surface of the second substrate 1310, and may be connected to a plurality of cell contact plugs 1341-1347 (1340). The electrodes 1330 and the cell contact plugs 1340 may be connected to each other through pads, which are provided as portions of the electrodes 1330 extended in the second direction D2 and have different lengths in the second direction D2. A first metal layer 1350*b* and a second metal layer 1360*b* may be sequentially connected to upper portions of the cell contact plugs 1340, which are connected to the electrodes 1330. In the word line bonding region WLBA, the cell contact plugs 1340 may be connected to the peripheral circuit structure PERI through the upper bonding metals 1371*b* and 1372*b* of the cell array structure CELL and the lower bonding metals 1271*b* and 1272*b* of the peripheral circuit structure PERI.

The cell contact plugs 1340 may be electrically connected to the circuit devices 1220*b*, which are provided in the peripheral circuit structure PERI to constitute a row decoder 1394. In an embodiment, an operation voltage of the circuit devices 1220*b* constituting the row decoder 1394 may be different from an operation voltage of the circuit devices 1220*c* constituting the page buffer 1393. As an example, the operation voltage of the circuit devices 1220*c* constituting the page buffer 1393 may be higher than the operation voltage of the circuit devices 1220*b* constituting the row decoder 1394.

A common source line contact plug 1380 may be disposed in the outer pad bonding region PA. The common source line contact plug 1380 may be formed of or include at least one of conductive materials (e.g., metals, metal compounds, or polysilicon) and may be electrically connected to the common source line 1320. A first metal layer 1350*a* and a second metal layer 1360*a* may be sequentially stacked on the common source line contact plug 1380. As an example, a region, in which the common source line contact plug 1380, the first metal layer 1350*a*, and the second metal layer 1360*a* are provided, may be defined as the outer pad bonding region PA.

Input/output pads 1205 and 1305 may be disposed in the outer pad bonding region PA. A lower insulating layer 1201 may be formed below the first substrate 1210 to cover a bottom surface of the first substrate 1210, and a first input/output pad 1205 may be formed on the lower insulating layer 1201. The first input/output pad 1205 may be connected to at least one of circuit devices 1220a, 1220b, and 1220c, which are provided in the peripheral circuit structure PERI, through a first input/output contact plug 1203, and may be spaced apart from the first substrate 1210 by the lower insulating layer 1201. In addition, a sidewall insulating layer may be disposed between the first input/output contact plug 1203 and the first substrate 1210 to electrically separate the first input/output contact plug 1203 from the first substrate 1210.

An upper insulating layer 1301 may be formed on the second substrate 1310 to cover the top surface of the second substrate 1310, and a second input/output pad 1305 may be disposed on the upper insulating layer 1301. The second input/output pad 1305 may be connected to at least one of the circuit devices 1220a, 1220b, and 1220c, which are provided in the peripheral circuit structure PERI, through a second input/output contact plug 1303. In an embodiment, the second input/output pad 1305 may be electrically connected to the circuit device 1220a.

In an embodiment, the second substrate 1310 and the common source line 1320 may not be disposed in a region provided with the second input/output contact plug 1303. In addition, the second input/output pad 1305 may not be overlapped with the electrodes 1330 in a third direction D3. The second input/output contact plug 1303 may be spaced apart from the second substrate 1310 in a direction, which is parallel to the top surface of the second substrate 1310, and may be provided to penetrate an interlayer insulating layer 1315 of the cell array structure CELL and to be connected to the second input/output pad 1305.

In an embodiment, the first input/output pad 1205 and the second input/output pad 1305 may be selectively formed. As an example, the memory device 1400 may include only the first input/output pad 1205, which is disposed on the first substrate 1210, or may include only the second input/output pad 1305, which is disposed on the second substrate 1310. Alternatively, the memory device 1400 may include both of the first and second input/output pads 1205 and 1305.

In an embodiment, a metal pattern, which serves as a dummy pattern, may be provided in the uppermost metal layer of each of the outer pad bonding region PA and the bit line bonding region BLBA, which are included in each of the cell array structure CELL and the peripheral circuit structure PERI, or may not be provided in the uppermost metal layer.

The memory device 1400 may include an upper metal pattern 1372a and a lower metal pattern 1273a, which are provided in the outer pad bonding region PA, and here, the lower metal pattern 1273a may be formed in the uppermost metal layer of the peripheral circuit structure PERI to be in contact with the upper metal pattern 1372a, which is formed in the uppermost metal layer of the cell array structure CELL, or to have substantially the same shape as the upper metal pattern 1372a of the cell array structure CELL. The lower metal pattern 1273a, which is formed in the uppermost metal layer of the peripheral circuit structure PERI, may not be connected to any contact plug in the peripheral circuit structure PERI. Similarly, in the outer pad bonding region PA, the upper metal pattern 1372a may be formed in the uppermost metal layer of the cell array structure CELL to be in contact with the lower metal pattern 1273a, which is formed in the uppermost metal layer of the peripheral circuit structure PERI, and to have substantially the same shape as the lower metal pattern 1273a of the peripheral circuit structure PERI.

The lower bonding metals 1271b and 1272b may be formed on the second metal layer 1240b in the word line bonding region WLBA. In the word line bonding region WLBA, the lower bonding metals 1271b and 1272b of the peripheral circuit structure PERI may be electrically connected to the upper bonding metals 1371b and 1372b of the cell array structure CELL in a bonding manner.

In the bit line bonding region BLBA, a lower metal pattern 1252 may be formed in the uppermost metal layer of the peripheral circuit structure PERI, and an upper metal pattern 1392 may be formed in the uppermost metal layer of the cell array structure CELL to have the same shape as the lower metal pattern 1252 of the peripheral circuit structure PERI. In an embodiment, any contact plug may not be formed on the upper metal pattern 1392, which is formed in the uppermost metal layer of the cell array structure CELL.

According to an embodiment of the inventive concept, it may be possible to improve an integration density and reliability of a semiconductor device and to realize an electronic system including the semiconductor device.

While example embodiments of the inventive concept have been particularly shown and described, it will be understood by one of ordinary skill in the art that variations in form and detail may be made therein without departing from the scope of the attached claims.

What is claimed is:

1. A semiconductor device, comprising:
an electrode structure comprising electrodes stacked on a substrate, and an insulating pattern on an uppermost electrode of the electrodes;
a vertical structure that penetrates the electrode structure and is electrically connected to the substrate, the vertical structure comprising a vertical semiconductor pattern and a conductive pad on the vertical semiconductor pattern;
a first insulating layer on the electrode structure and the vertical structure, wherein the insulating pattern is between the first insulating layer and the uppermost electrode;
a capping pattern on the conductive pad between the first insulating layer and the conductive pad, the capping pattern comprising a different material than the first insulating layer;
a conductive pattern that penetrates the first insulating layer and the capping pattern, and is electrically connected to the vertical structure;
an upper horizontal electrode on the conductive pattern;
an upper separation pattern that crosses the upper horizontal electrode in a first direction; and
an upper semiconductor pattern that penetrates the upper horizontal electrode and is electrically connected to the conductive pattern,
wherein the conductive pattern has a first side surface on the vertical structure and a second side surface on the insulating pattern, and
the upper separation pattern is vertically overlapping with the vertical structure.

2. The semiconductor device of claim 1, wherein a thickness of a first portion of the conductive pattern having the first side surface is greater than a thickness of a second portion of the conductive pattern having the second side surface, and an interface between the first and second portions of the conductive pattern comprises a step difference, and wherein the first insulating layer has etch selectivity with respect to the insulating pattern.

3. The semiconductor device of claim 1, wherein the upper semiconductor pattern comprises a first portion, and a second portion that connects the first portion to the conductive pattern and has a width less than that of the first portion, and the conductive pattern has a width greater than that of the second portion.

4. The semiconductor device of claim 1, wherein a bottom end of the conductive pattern is closer to the substrate than a top surface of the insulating pattern.

5. The semiconductor device of claim 1, wherein a height of the first side surface is greater than a thickness of the first insulating layer.

6. The semiconductor device of claim 5, wherein the capping pattern is directly on the conductive pad, and faces the first side surface, and the conductive pattern extends through the first insulating layer and the capping pattern to directly contact the conductive pad.

7. The semiconductor device of claim 5, wherein the capping pattern is thinner than the first insulating layer, and the capping pattern has etch selectivity with respect to the first insulating layer.

8. The semiconductor device of claim 5, wherein the upper horizontal electrode comprises a string selection line of a string selection transistor, and wherein the conductive pattern electrically connects the vertical structure to the string selection transistor.

9. The semiconductor device of claim 1, wherein the conductive pattern has a width greater than a width of the upper separation pattern in a second direction perpendicular to the first direction.

10. The semiconductor device of claim 1, wherein the vertical structure comprises a vertical insulating pattern on the vertical semiconductor pattern, and a top surface of the conductive pad is closer to the substrate than a top surface of the vertical insulating pattern.

11. The semiconductor device of claim 1, further comprising a second insulating layer between the first insulating layer and the upper horizontal electrode, wherein the second insulating layer is on a portion of a top surface of the conductive pattern.

12. The semiconductor device of claim 1, further comprising:

an upper conductive pad on the upper semiconductor pattern, and bit lines electrically connected to the upper conductive pad.

13. A semiconductor device, comprising:

an electrode structure comprising electrodes and insulating patterns that are alternately stacked;

a pair of separation structures crossing the electrode structure and spaced apart from each other in a first direction;

a vertical structure between the pair of separation structures and penetrating the electrode structure, the vertical structure comprising a vertical semiconductor pattern and a conductive pad on the vertical semiconductor pattern;

a first insulating layer on the electrode structure and the vertical structure;

a capping pattern between the first insulating layer and the conductive pad, wherein the capping pattern is on the conductive pad, and the capping pattern comprises a different material than the first insulating layer;

a conductive pattern that penetrates the first insulating layer and the capping pattern and is electrically connected to the conductive pad;

a second insulating layer on the first insulating layer and the conductive pattern;

an upper horizontal electrode on the second insulating layer;

a pair of first upper separation patterns crossing the upper horizontal electrode in a second direction perpendicular to the first direction and vertically overlapping with the pair of separation structures;

a second upper separation pattern between the pair of first upper separation patterns and crossing the upper horizontal electrode in the second direction;

an upper channel structure that penetrates the upper horizontal electrode and the second insulating layer and is electrically connected to the conductive pad, the upper channel structure comprising an upper semiconductor pattern and an upper insulating pattern on the upper semiconductor pattern;

an interlayer insulating layer on the upper channel structure;

a bit line on the interlayer insulating layer; and a contact plug that penetrates the interlayer insulating layer and electrically connects the bit line to the upper channel structure.

14. The semiconductor device of claim 13, wherein the conductive pattern comprises a first portion having a first side surface on the conductive pad, and a second portion having a second side surface on an uppermost one of the insulating patterns, and a thickness of the first portion is greater than a thickness of the second portion, and an interface between the first and second portions of the conductive pattern comprises a step difference.

15. The semiconductor device of claim 13, wherein the upper semiconductor pattern comprises a first portion, and a second portion that connects the first portion to the conductive pattern and has a width less than that of the first portion, and the conductive pattern has a width greater than that of the second portion.

16. The semiconductor device of claim 13, wherein a bottom end of the conductive pattern is closer to the electrode structure than a top surface of the upper insulating pattern.

17. The semiconductor device of claim 13, wherein a thickness of a largest portion of the conductive pattern is greater than a thickness of the first insulating layer.

18. The semiconductor device of claim 13, wherein the upper horizontal electrode comprises a string selection line that is configured to select a memory cell string defined by the vertical structure.

19. An electronic system, comprising:

a main substrate;

a semiconductor device on the main substrate; and a controller on the main substrate and electrically connected to the semiconductor device, wherein the semiconductor device comprises:

a peripheral circuit on a substrate;

an electrode structure comprising electrodes stacked on the peripheral circuit, and an insulating pattern on an uppermost one of the electrodes;

a vertical structure that penetrates the electrode structure and is electrically connected to the substrate, the vertical structure comprising a vertical semiconductor pattern and a conductive pad on the vertical semiconductor pattern;

a first insulating layer on the insulating pattern and the vertical structure, wherein the insulating pattern is between the first insulating layer and the uppermost one of the electrodes;

a capping pattern on the conductive pad between the first insulating layer and the conductive pad, wherein the capping pattern comprises a different material than the first insulating layer;

a conductive pattern that penetrates the first insulating layer and the capping pattern and is electrically connected to the vertical structure;

an upper horizontal electrode on the conductive pattern; and an upper channel structure that penetrates the upper horizontal electrode and is electrically connected to the conductive pattern, wherein the conductive pattern comprises a first side surface on the vertical structure and a second side surface on the insulating pattern.

20. The electronic system of claim 19, wherein a thickness of a first portion of the conductive pattern having the first side surface is greater than a thickness of a second portion of the conductive pattern having the second side surface, and an interface between the first and second portions of the conductive pattern comprises a step difference.

* * * * *